(12) United States Patent
Ching et al.

(10) Patent No.: US 11,171,053 B2
(45) Date of Patent: Nov. 9, 2021

(54) TRANSISTOR DEVICE AND RELATED METHODS

(71) Applicant: Taiwan Semiconductor Manufacturing Co., Ltd., Hsinchu (TW)

(72) Inventors: Kuo-Cheng Ching, Hsinchu County (TW); Lin-Yu Huang, Hsinchu (TW); Huan-Chieh Su, Changhua County (TW); Sheng-Tsung Wang, Hsinchu (TW); Zhi-Chang Lin, Hsinchu County (TW); Jia-Chuan You, Taoyuan County (TW); Chia-Hao Chang, Hsinchu (TW); Tien-Lu Lin, Hsinchu (TW); Yu-Ming Lin, Hsinchu (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 27 days.

(21) Appl. No.: 16/422,559

(22) Filed: May 24, 2019

(65) Prior Publication Data
US 2020/0035558 A1 Jan. 30, 2020

Related U.S. Application Data

(60) Provisional application No. 62/711,298, filed on Jul. 27, 2018.

(51) Int. Cl.
*H01L 21/768* (2006.01)
*H01L 21/28* (2006.01)
*H01L 29/40* (2006.01)
*H01L 29/78* (2006.01)

(52) U.S. Cl.
CPC .. *H01L 21/76897* (2013.01); *H01L 21/28247* (2013.01); *H01L 21/7684* (2013.01); *H01L 21/76802* (2013.01); *H01L 21/76819* (2013.01); *H01L 21/76834* (2013.01); *H01L 21/76843* (2013.01); *H01L 29/401* (2013.01); *H01L 29/785* (2013.01)

(58) Field of Classification Search
CPC ....... H01L 21/823437; H01L 21/76834; H01L 21/76897; H01L 29/785
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Sarah K Salerno
(74) *Attorney, Agent, or Firm* — Haynes and Boone, LLP

(57) ABSTRACT

A method of forming a semiconductor device includes providing a device having a gate stack including a metal gate layer. The device further includes a spacer layer disposed on a sidewall of the gate stack and a source/drain feature adjacent to the gate stack. The method further includes performing a first etch-back process to the metal gate layer to form an etched-back metal gate layer. In some embodiments, the method includes depositing a metal layer over the etched-back metal gate layer. In some cases, a semiconductor layer is formed over both the metal layer and the spacer layer to provide a T-shaped helmet layer over the gate stack and the spacer layer.

20 Claims, 20 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,083,863 B1* | 9/2018 | Hsieh ................ H01L 21/32134 |
| 2014/0353734 A1* | 12/2014 | Xie ................... H01L 21/76834 257/288 |
| 2015/0357409 A1* | 12/2015 | Horak ............... H01L 21/28008 257/407 |
| 2018/0350662 A1* | 12/2018 | You ....................... H01L 29/785 |
| 2019/0164829 A1* | 5/2019 | Yang ................ H01L 29/41791 |

\* cited by examiner

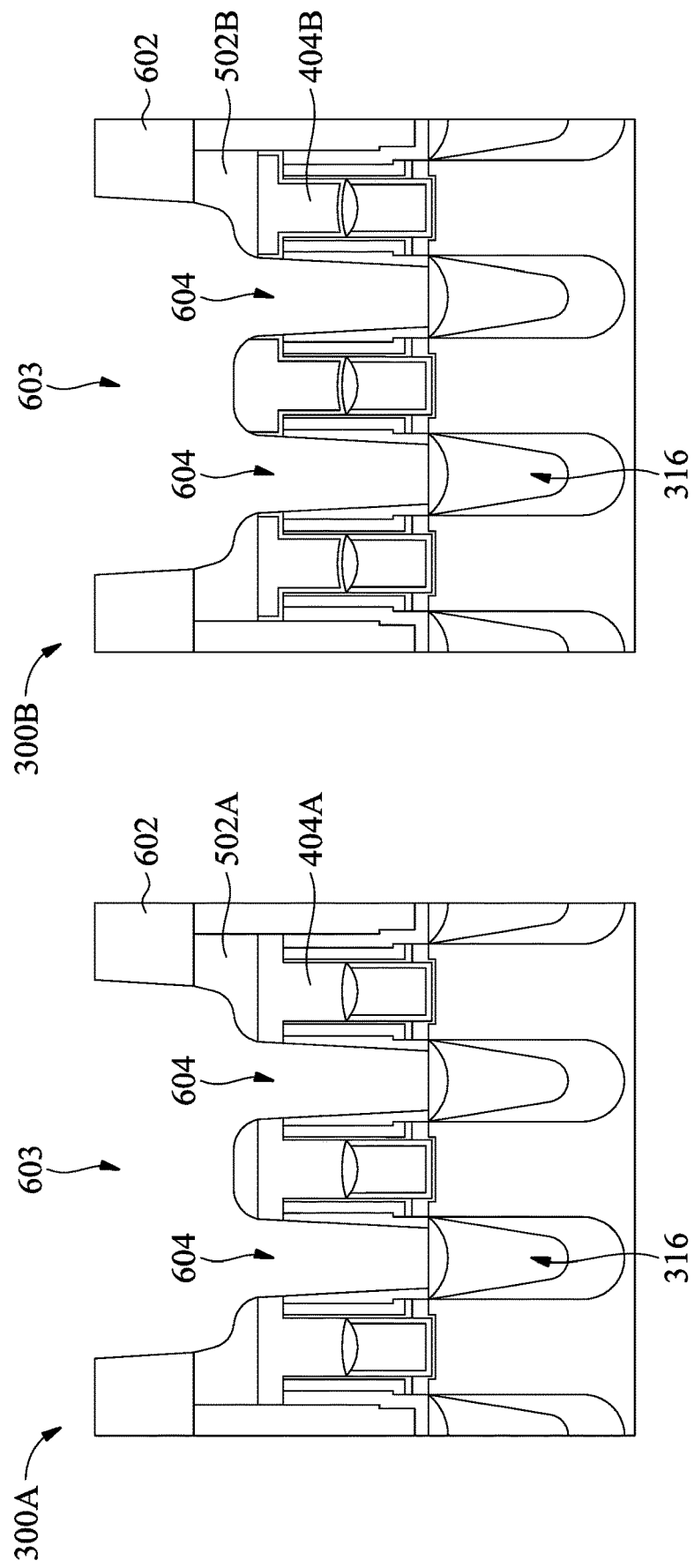

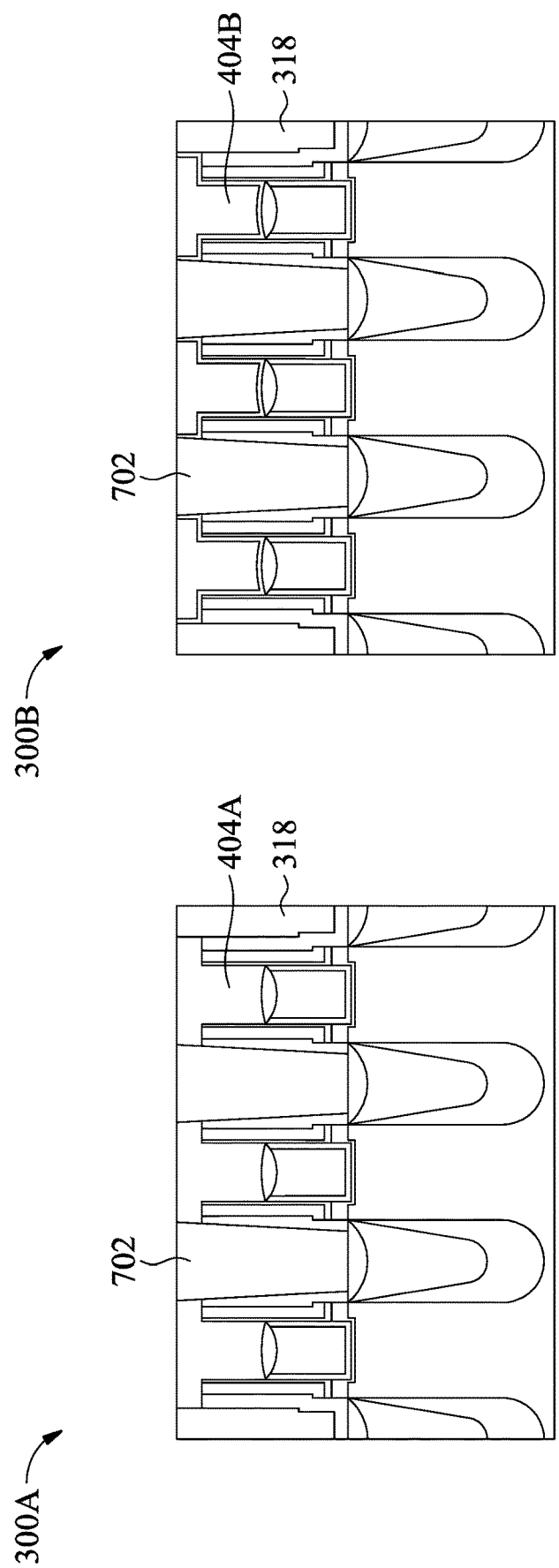

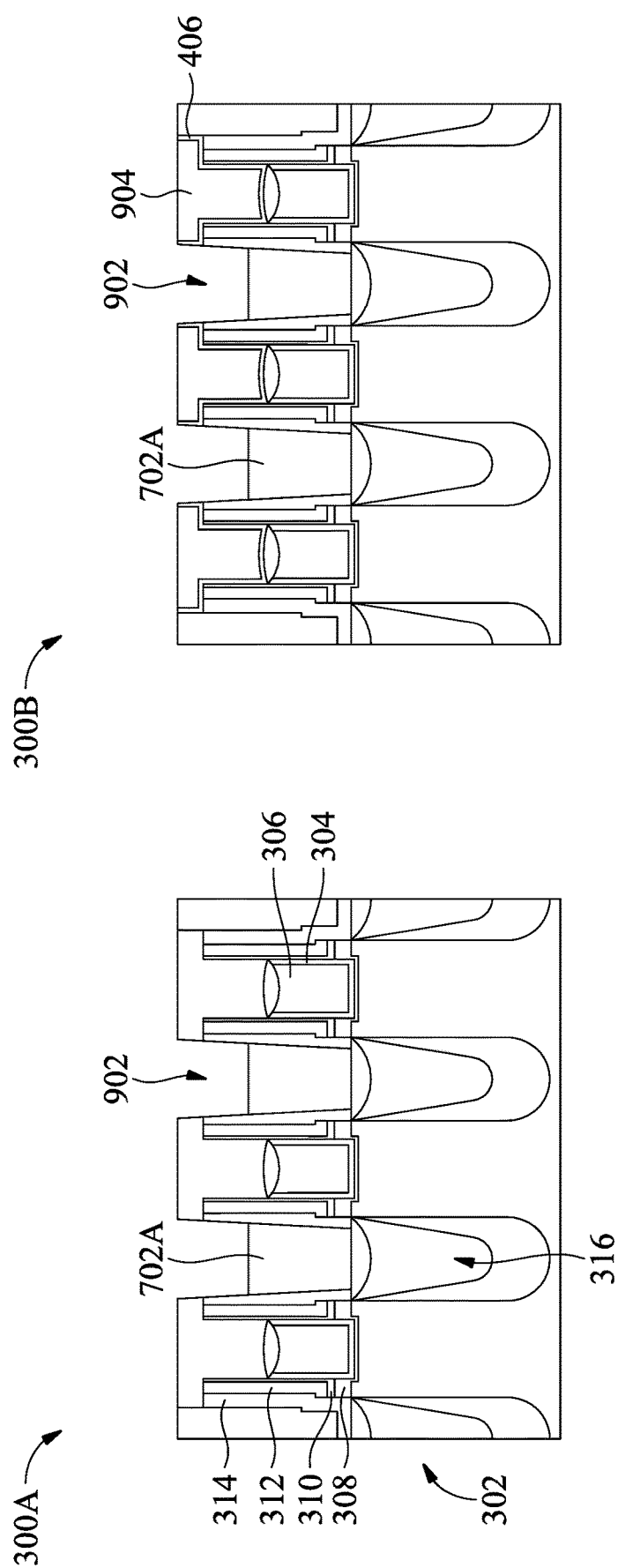

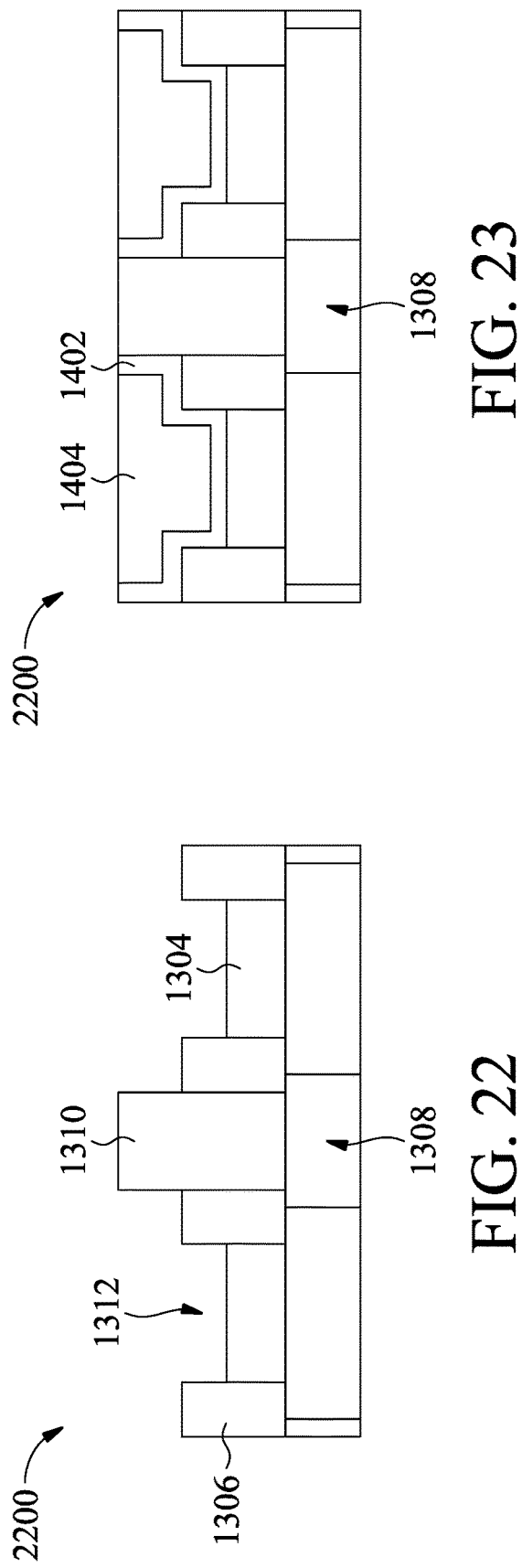
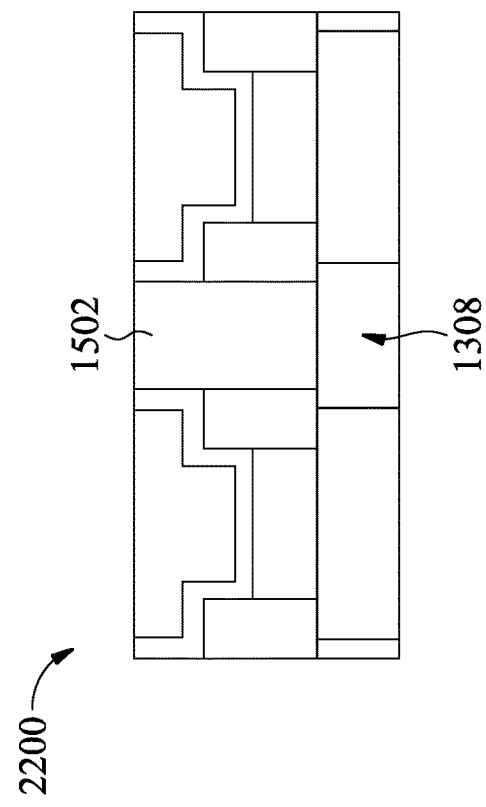
FIG. 22
FIG. 23
FIG. 24

TRANSISTOR DEVICE AND RELATED METHODS

CROSS-REFERENCE TO RELATED APPLICATION

This application claims the benefit of U.S. Provisional Application No. 62/711,298, filed Jul. 27, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, even with the introduction of FinFETs, aggressive scaling down of IC dimensions has resulted in increased parasitic capacitance (e.g., between a FinFET gate and source/drain regions or source/drain contacts), among other issues, that have resulted in degradation of device performance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5A, 5B, 6A, 6B, 7A, 7B, 8A, 8B, 9A, 9B, 10A, 10B, 11A, and 11B provide cross-sectional views, along a plane substantially parallel to a plane defined by section AA' of FIG. 1, of exemplary devices fabricated according to one or more steps of the method of FIG. 2;

FIGS. 22, 23, 24, 25, 26, 27 and 28 provide cross-sectional views, along a plane substantially parallel to a plane defined by section AA' of FIG. 1, of exemplary devices fabricated according to one or more steps of the method of FIG. 21.

DETAILED DESCRIPTION

Figure 1:
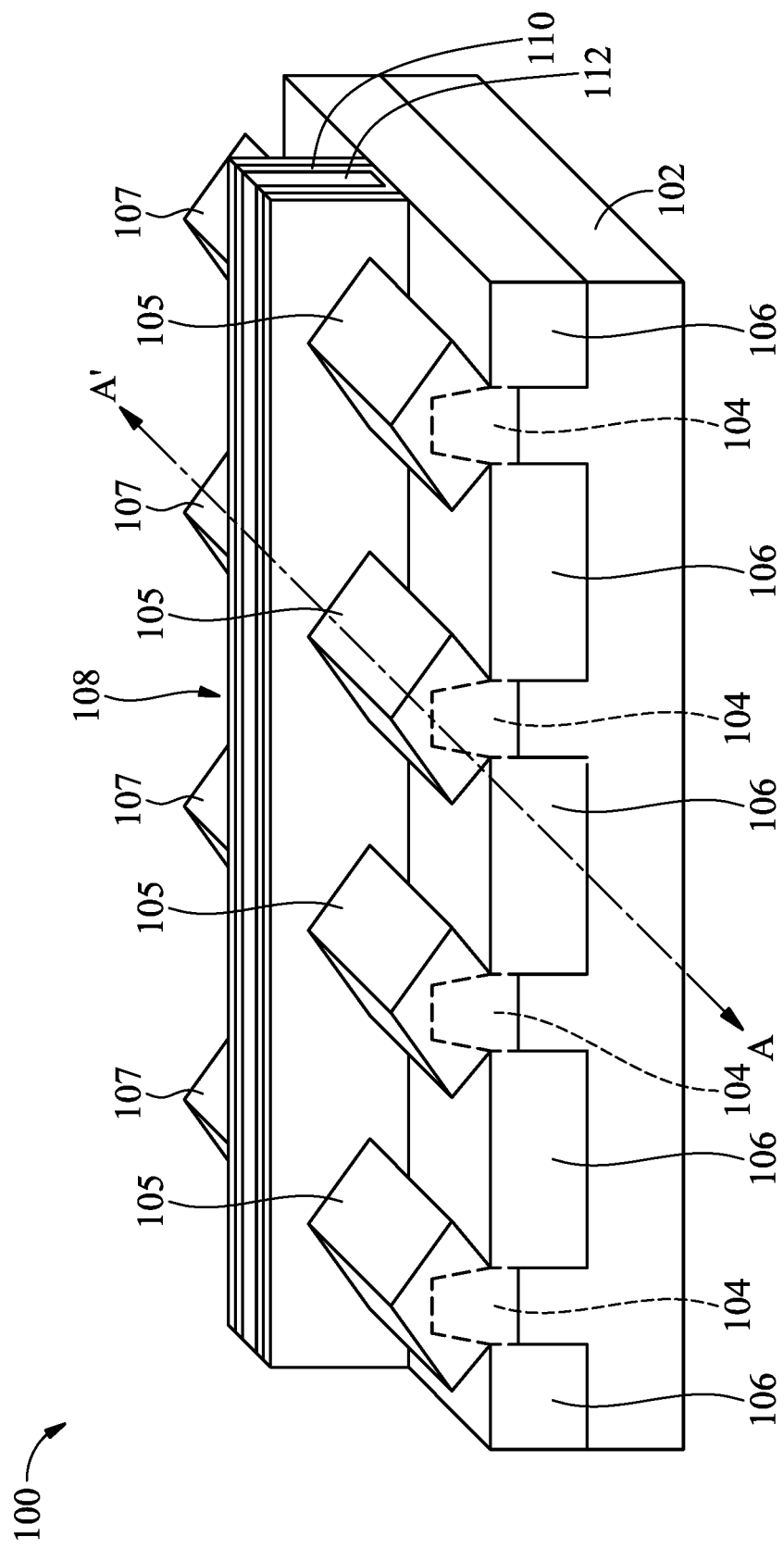
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include an SOI structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section AA' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2/V-s$ and a hole mobility of around 480 $cm^2/V-s$, in some instances.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack including a gate dielectric layer 110, and a metal layer 112 formed over the gate dielectric layer. In some embodiments, the gate dielectric layer 110 may include an interfacial layer formed over the channel region of the fin 104 and a high-K dielectric layer over the interfacial layer. The interfacial layer of the gate dielectric layer 110 may include a dielectric material such as silicon oxide layer ($SiO_2$) or silicon oxynitride (SiON). The high-K dielectric layer of the gate dielectric layer 110 may include $HfO_2$, $TiO_2$, $HfZrO$, $Ta_2O_3$, $HfSiO_4$, $ZrO_2$, $ZrSiO_2$, combinations thereof, or other suitable materials. In still other embodiments, the gate dielectric layer 110 may include silicon dioxide or another suitable dielectric. The gate dielectric layer 110 may be formed by chemical oxidation, thermal oxidation, atomic layer deposition (ALD), physical vapor deposition (PVD), chemical vapor deposition (CVD), and/or other suitable methods. The metal layer 112 may include a conductive layer such as W, TiN, TaN, WN, Re, Ir, Ru, Mo, Al, Cu, Co, Ni, combinations thereof, and/or other suitable compositions. In some embodiments, the metal layer 112 may include a first group of metal materials for N-type FinFETs and a second group of metal materials for P-type FinFETs. Thus, the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 112 may provide a gate electrode for the FinFET device 100, including both N-type and P-type FinFET devices 100. In some embodiments, the metal layer 112 may alternately include a polysilicon layer. The metal layer 112 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

As noted above, aggressive scaling down of IC dimensions has resulted in increased parasitic capacitance (e.g., between a FinFET gate and source/drain regions or source/drain contacts), among other issues, that have degraded device performance. For example, in an effort to avoid metal bridging between a transistor source/drain and a gate, a self-aligned contact (SAC) fabrication method has been introduced. However, in at least some conventional SAC fabrication methods, the materials and methods used may result in a high total capacitance (Ctotal) and device speed degradation. In addition, at least some existing processes may result in metal layer loss, interlayer dielectric (ILD) loss, and/or spacer loss during an etch-back process (e.g., during a SiN etch-back process). Other issues with at least some existing SAC fabrication methods include metal gate oxidation and gate height loss/loading, among others. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for reducing a transistor Ctotal, protecting against layer loss, avoiding metal gate oxidation, and mitigating gate height loss/loading, among others, and thereby improving device performance. In some embodiments, a bilayer helmet SAC scheme is provided, which may be used to provide a high source/drain metal (MD) etch selectivity and a low Ctotal. In some embodiments, the bilayer helmet includes a T-shaped helmet that includes a low-K material. Additionally, in some embodiments, a liner layer (e.g., a metal-oxide liner layer) may be used to protect a metal layer (e.g., such as a fluorine-free tungsten layer (FFW)), an ILD layer, and a spacer layer during an etch-back process (e.g., during a SiN etch-back process) to avoid a work-function metal induced threshold voltage (Vt) shift. Various embodiments disclosed herein may also generally be used to reduce process cost and complexity. Additional embodiments and advantages are discussed below and/or will be evident to those skilled in the art in possession of this disclosure.

Figure 2:
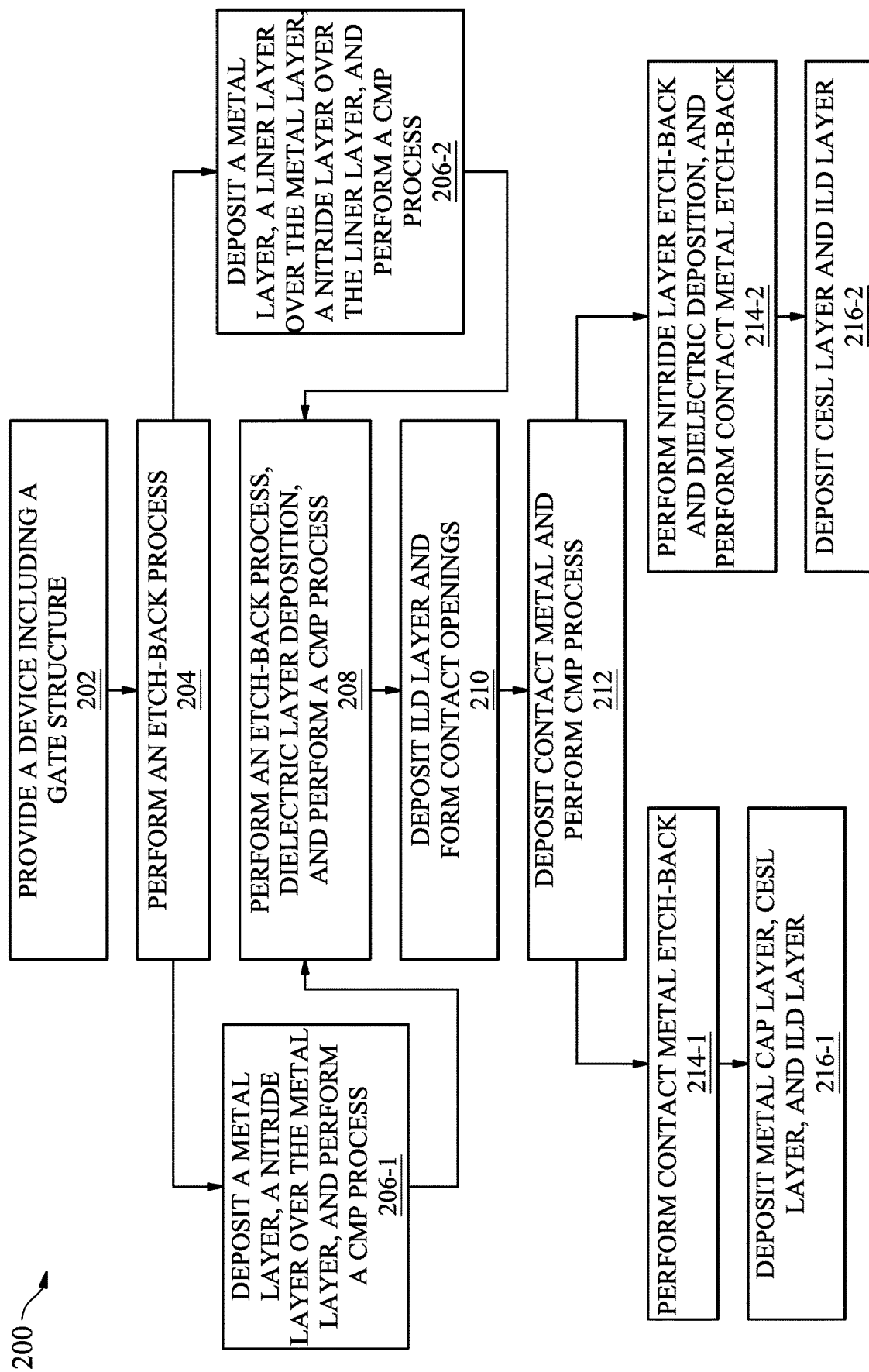
FIG. 2 is a flow chart of a method of fabricating a semiconductor device including a T-shaped helmet, in accordance with some embodiments.

Referring now to FIG. 2, illustrated is a method 200 of fabricating a semiconductor device (e.g., such as a FinFET device) including a T-shaped helmet, for example as part of a SAC process flow, in accordance with one or more embodiments. In some embodiments, the method 200 may be used to fabricate the device 100, described above with reference to FIG. 1. Thus, one or more aspects discussed above with reference to the device 100 may also apply to the method 200. Additionally, FIGS. 3, 4A, 4B, 5A, 5B, 6A, 6B, 7A, 7B, 8A, 8B, 9A, 9B, 10A, 10B, 11A, and 11B provide cross-sectional views, along a plane substantially parallel to a plane defined by section AA' of FIG. 1, of exemplary devices 300, 300A, 300B, 1100A, and 1100B fabricated according to one or more steps of the method 200 of FIG. 2.

It is understood that parts of the method 200 and/or the semiconductor device 300 may be fabricated by a well-known CMOS technology process flow, and thus some processes are only briefly described herein. In addition, as described above, the devices 300, 300A, 300B, 1100A, and 1100B may share aspects of the device 100, thus some aspects and/or processes of the devices 300, 300A, 300B, 1100A, and 1100B are only discussed briefly for purposes of clarity in understanding. Further, the semiconductor devices 300, 300A, 300B, 1100A, and 1100B may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor devices 300, 300A, 300B, 1100A, and 1100B include a plurality of semiconductor devices (e.g., transistors), which may be interconnected.

In various embodiments, the devices 300, 300A, 300B, 1100A, and 1100B may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), high voltage transistors, high frequency transistors, other memory cells, and/or combinations thereof.

Figure 3:
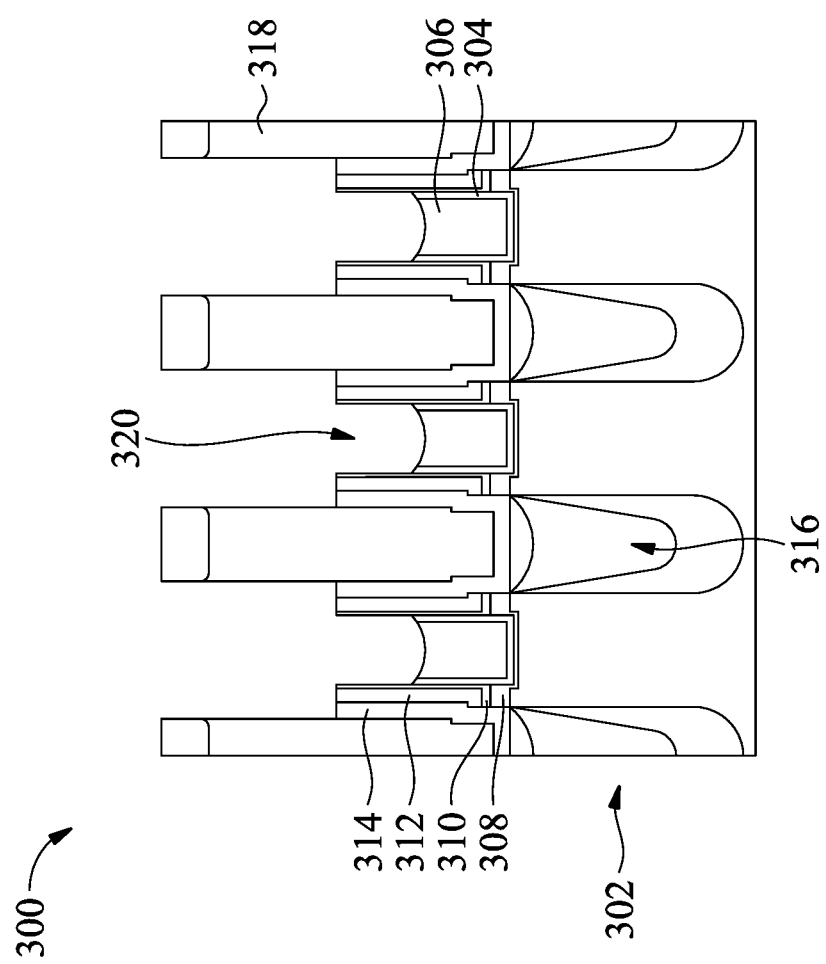

Referring now to the method 200, the method 200 begins at block 202 where a device including a gate structure is provided. Referring to FIG. 3, and in an embodiment of block 202, illustrated therein is a device 300 including a fin 302 that extends from a substrate, a gate stack including a gate dielectric layer 304, and a metal layer 306 over the gate dielectric layer 304. In some embodiments, the substrate, the fin 302, the gate dielectric layer 304, and the metal layer 306 may be substantially similar to the substrate 102, the fin elements 104, the gate dielectric layer 110, and the metal layer 112 discussed above with reference to FIG. 1. The device 300 also includes a plurality of sidewall spacer layers 308, 310, 312 formed on sidewalls of the gate stack. In some embodiments, the spacer layers 308, 310, 312 may include a dielectric material such as silicon oxide, SiN, SiC, SiON, SiOC, SiOCN, SiCN, or combinations thereof.

In some embodiments, the device 300 also includes epitaxial source/drain features 316 which may be formed by one or more epitaxial processes. In some cases, the epitaxial source/drain features 316 may be formed in, on, and/or surrounding the fin 302. In various examples, a silicide layer may be formed over the epitaxial source/drain features 316, for example, to reduce contact resistance. In some cases, the device 300 includes an ILD layer 318 over the epitaxial source/drain features 316, interposing adjacent gate structures. By way of example, the ILD layer 318 may include an oxide layer, a low-K dielectric layer, or other appropriate dielectric layer. In some embodiments, a liner layer 314 is formed interposing the spacer layers 308, 310, 312 and the ILD layer 318, and interposing the epitaxial source/drain features 316 and the ILD layer 318. In some examples, the liner layer 318 may be formed prior to forming the ILD layer 318. In some embodiments, the liner layer 318 includes a SiN layer.

The method 200 then proceeds to block 204 where an etch-back process is performed. Still referring to the example of FIG. 3, in an embodiment of block 204, a metal gate etch-back process is performed to etch-back the metal layer 306 and optionally the gate dielectric layer 304. In some embodiments, the metal gate etch-back process may include a wet etch, a dry etch, or a combination thereof. In a further embodiment of block 204, a sidewall etch-back process may be used to etch-back the spacer layer 312 and the liner layer 314. In some examples, the sidewall etch-back process may include a wet etch, a dry etch, or a combination thereof. In various examples, the metal gate etch-back process may be performed before the sidewall etch-back process. Alternatively, in some embodiments, the sidewall etch-back process may be performed before the metal gate etch-back process. It is also noted that the etch-back process of block 204 may result in a generally T-shaped opening 320 over the gate stack, as shown in FIG. 3.

After block 204, and in some embodiments, the method 200 may then proceed to block 206-1 where a metal layer and a nitride layer are deposited, and where a CMP process is performed. Referring to the example of FIGS. 3 and 4A, in an embodiment of block 206-1, a metal layer 402 is deposited over the etched-back metal layer 306 within the T-shaped opening 320. In some embodiments, the metal layer 402 includes W, although other suitable metals may also be used. In at least some examples, the metal layer 402 includes a fluorine-free W (FFW) layer. In various embodiments, the metal layer 402 may be deposited using CVD, ALD, PVD, or other suitable method. In a further embodiment of block 206-1, a nitride layer 404 is deposited over the metal layer 402, and over the etched-back spacer layer 312 and liner layer 314, where the nitride layer 404 substantially fills the T-shaped opening 320 to provide a T-shaped helmet layer. In some embodiments, the nitride layer 404 includes a SiN layer. In some embodiments, an amorphous silicon (a-Si) layer may be deposited, instead of SiN, over the metal layer 402 to substantially fill the T-shaped opening 320. In various examples, the nitride layer 404 (or a-Si) may be deposited by ALD, CVD, PVD, or by another suitable method. In various embodiments, the layer 404 may alternatively include a dielectric material such as silicon oxide, SiCN, SiOC, SiOCN, a low-K dielectric material, a-Si, or a combination thereof. In some embodiments, the layer 404 has a dielectric constant less than 7. After deposition of the nitride layer 404 (or a-Si layer), and in an embodiment of block 206-1, a CMP process is performed. In some cases, the CMP process is performed to planarize a top surface of the device 300. For clarity, and for the remainder of the discussion of the method 200, the device 300 processed according to block 206-1 may be referred to as a device 300A, for example as shown in FIGS. 4A-10A.

Alternatively, after block 204 and in some embodiments, the method 200 may proceed to block 206-2 where a metal layer, a liner layer, and a nitride layer are deposited, and where a CMP process is performed. Referring to the example of FIGS. 3 and 4B, in an embodiment of block 206-2, a metal layer 402 is deposited over the etched-back metal layer 306 within the T-shaped opening 320. In some embodiments, the metal layer 402 may be substantially the same as discussed above with reference to FIG. 4A. In a further embodiment of block 206-2, after forming the metal layer 402, a liner layer 406 may be conformally deposited within the T-shaped opening 320, for example, over the metal layer 402 and on sidewalls of adjacent spacer and/or ILD layers. In some embodiments, the liner layer 406 includes a high-K material layer such as $HfO_2$, $ZrO_2$, $Al_2O_3$, or other appropriate high-K material, where the high-K material layer may be deposited by CVD, ALD, or other appropriate method. In some embodiments, the liner layer 406 has a thickness of about 0.5-5 nm. In some examples, after forming the liner layer 406, a nitride layer 404 is deposited over the liner layer 406, where the nitride layer 404 substantially fills the T-shaped opening 320. In some embodiments, the nitride layer 404 may be substantially the same as discussed above with reference to FIG. 4A. In some embodiments, an a-Si layer may be deposited over the liner layer 406, instead of SiN, where the a-Si layer substantially fills the T-shaped opening 320. After deposition of the nitride layer 404 (or a-Si layer), and in an embodiment of block 206-2, a CMP process is performed, for example, to planarize a top surface of the device 300. For clarity, and for the remainder of the discussion of the method 200, the device 300 processed according to block 206-2 may be referred to as a device 300B, for example as shown in FIGS. 4B-10B.

Figures 4A, 4B:
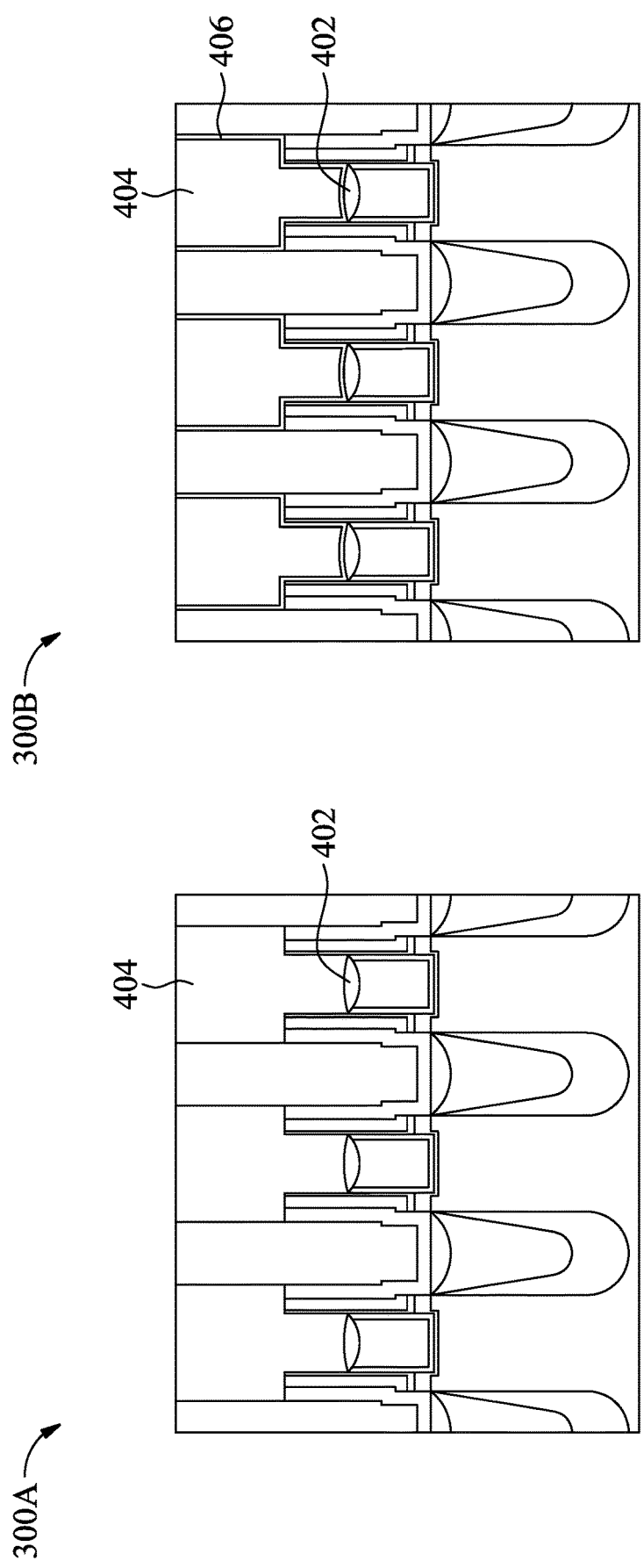
Figures 5A, 5B:
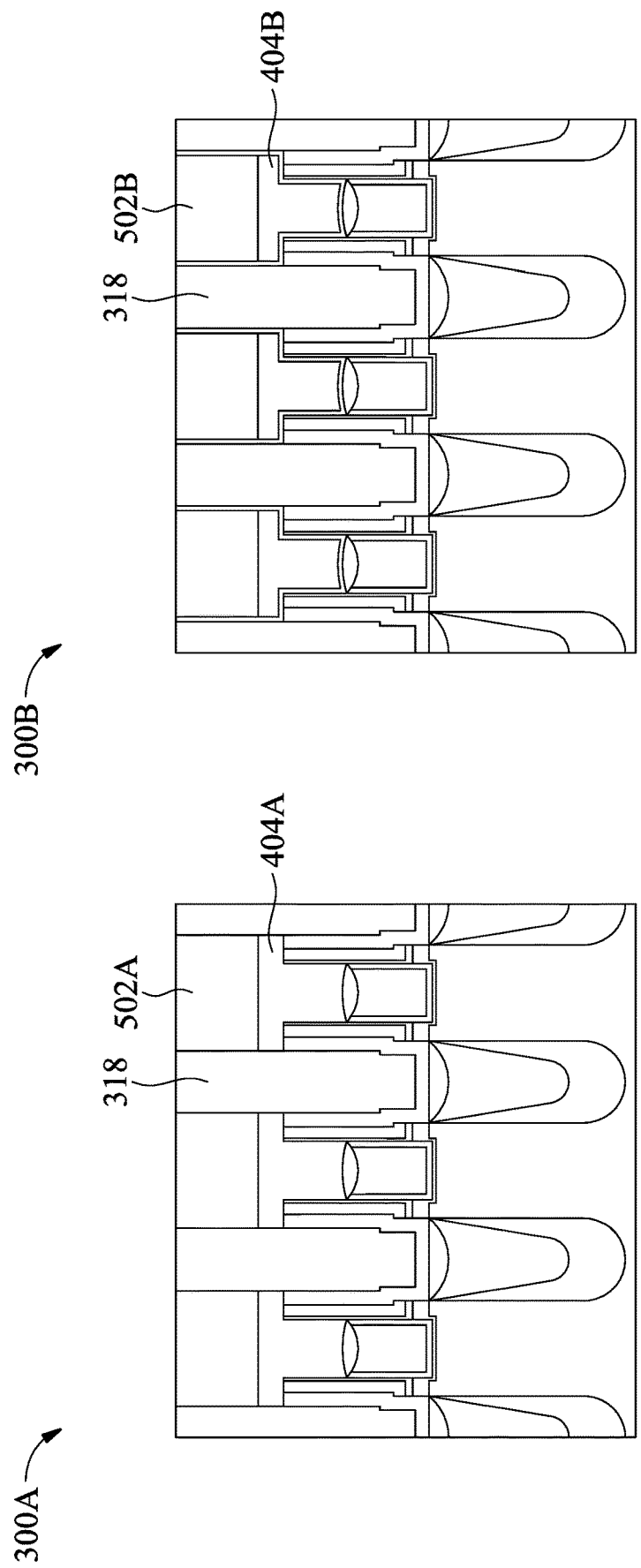
Figures 7A, 7B:
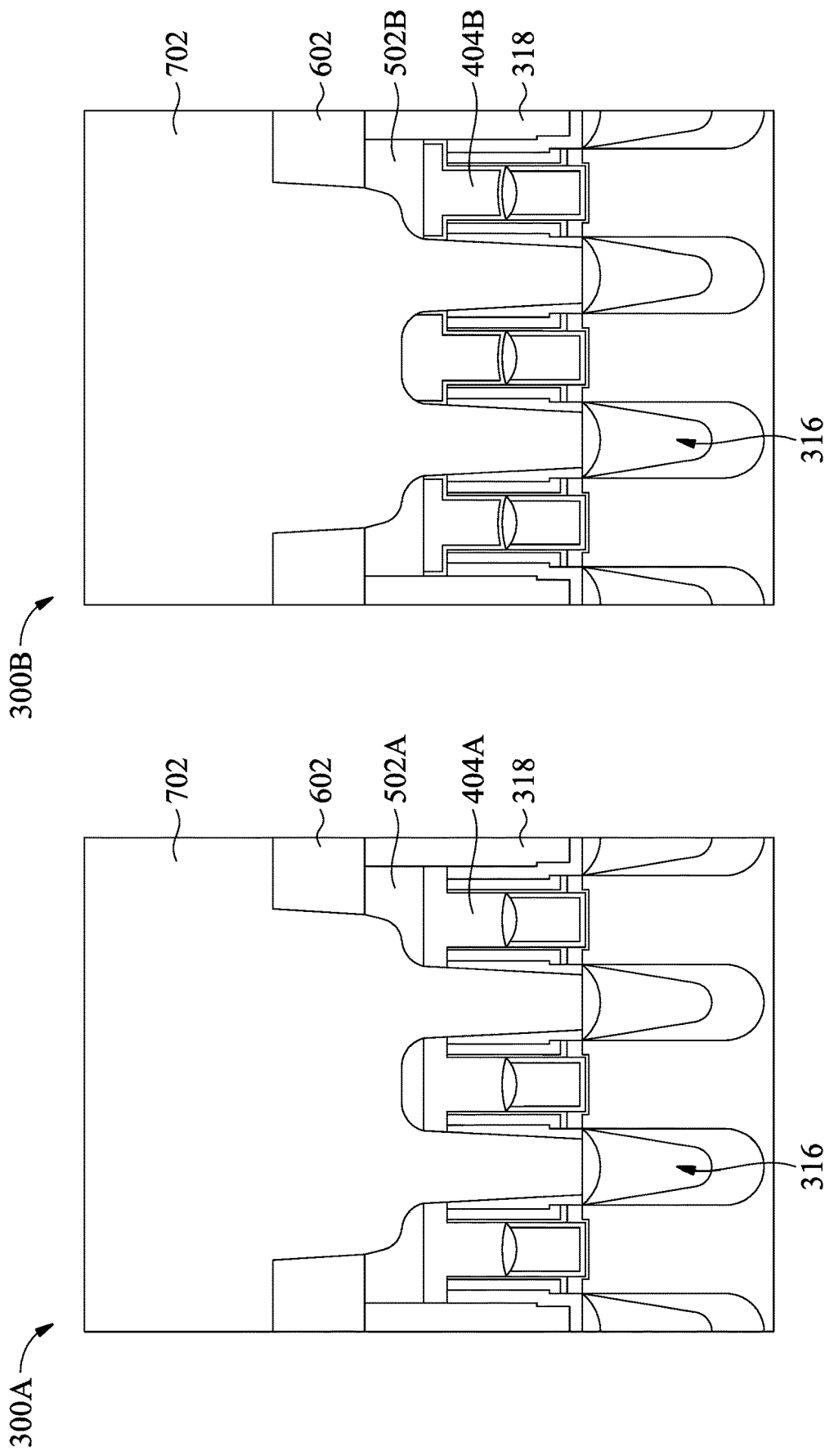

After block 206-1 or 206-2, the method 200 proceeds to block 208 where an etch-back process is performed, a dielectric layer is deposited, and a CMP process is performed. Referring first to the device 300A as shown in FIGS. 4A and 5A, in an embodiment of block 208, the nitride layer 404 (or a-Si layer) is etched back to provide an etched-back nitride layer 404A (or etched-back a-Si layer). In some embodiments, the etch-back process may include a wet etch, a dry etch, or a combination thereof. Thereafter, in a further embodiment of block 208, a dielectric layer 502A is deposited over the etched-back nitride layer 404A. In some embodiments, the dielectric layer 502A includes a high-K dielectric layer such as $HfO_2$, $TiO_2$, $HfZrO$, $Ta_2O_3$, $HfSiO_4$, $ZrO_2$, $ZrSiO_2$, $Al_2O_3$, combinations thereof, or other suitable materials. In some embodiments, the dielectric layer 502A has a dielectric constant greater than 7. In various examples, the dielectric layer 502A may be deposited by ALD, CVD, or other suitable deposition process. After deposition of the dielectric layer 502A, and in an embodiment of block 208, a CMP process is performed to planarize a top surface of the device 300A.

Referring now to the device 300B as shown in FIGS. 4B and 5B, in a further embodiment of block 208, the nitride layer 404 (or a-Si layer) is etched back to provide an etched-back nitride layer 404B (or etched-back a-Si layer). In some embodiments, the liner layer 406 may also be etched-back, for example, during or after forming the etched-back nitride layer 404B. In some embodiments, the etch-back process may include a wet etch, a dry etch, or a combination thereof. Thereafter, in a further embodiment of block 208, a dielectric layer 502B is deposited over the etched-back nitride layer 404B (and over the optionally etched-back liner layer 406). In some embodiments, the dielectric layer 502B includes a high-K dielectric layer such as $HfO_2$, $TiO_2$, $HfZrO$, $Ta_2O_3$, $HfSiO_4$, $ZrO_2$, $ZrSiO_2$, $Al_2O_3$, combinations thereof, or other suitable materials, and may be deposited by ALD, CVD, or other suitable deposition process. In some embodiments, the dielectric layer 502B has a dielectric constant greater than 7. After deposition of the dielectric layer 502B, and in an embodiment of block 208, a CMP process is performed to planarize a top surface of the device 300B.

The method 200 proceeds to block 210 where an ILD layer is deposited and contact openings are formed. Referring to the example of FIGS. 6A (device 300A) and 6B (device 300B), in an embodiment of block 210, an ILD layer 602 is deposited over each of the devices 300A and 300B. By way of example, the ILD layer 602 may include an oxide layer, a low-K dielectric layer, or other appropriate dielectric layer. After formation of the ILD layer 602, source/drain contact patterning and etching processes are performed. For example, the source/drain contact patterning process may include depositing a resist layer over the ILD layer 602, exposing the resist to a pattern, performing post-exposure bake processes, and developing the resist to form a patterned resist layer (e.g., a masking element) over the ILD layer 602. In some embodiments, the patterned resist layer may then be used to protect regions of the substrate while an etching process is used to form an opening 603 in the ILD layer 602, and to form contact openings 604 that expose the epitaxial source/drain features 316, as shown in FIGS. 6A and 6B. In various embodiments, the opening 603 and the contact openings 604 may be etched using a dry etch, a wet etch, or a combination thereof. As part of the process of forming the opening 603 and the contact openings 604, and in some examples, the etching process may etch portions of the ILD layer 602, the ILD layer 318 over the epitaxial source/drain features 316, and portions of the dielectric layers 502A, 502B. In some cases, the dielectric layers 502A, 502B may protect the etched-back nitride (or etched-back a-Si) layer 404A, 404B during the etching process.

The method 200 proceeds to block 212 where a contact metal is deposited, and a CMP process is performed. Referring first to the example of FIGS. 7A (device 300A) and 7B (device 300B), in an embodiment of block 212, a metal layer 702 is deposited over each of the devices 300A and 300B. In particular, the metal layer 702 may be deposited within the opening 603 and within the contact openings 604 over the epitaxial source/drain features 316, such that metal layer 702 provides an electrical connection to the epitaxial source/drain features 316. In at least some examples, the metal contact layer 316 includes a Co layer, although other suitable metals may be used without departing from the scope of the present disclosure. In some cases, the metal layer 702 may be deposited by PVD, e-beam evaporation, CVD, ALD, or other appropriate method. After forming the metal layer 702, and in a further embodiment of block 212, a CMP process is performed. For example, with reference to FIGS. 8A and 8B, a CMP process may be performed to remove portions of the metal layer 702 and to planarize a top surface of the devices 300A and 300B. In addition, in some embodiments, the CMP process may be used to remove the ILD layer 602, as well as the dielectric layers 502A, 502B from over the etched-back nitride (or etched-back a-Si) layer 404A, 404B. In some cases, the CMP process may also recess remaining portions of the ILD layer 318, as shown.

After block 212, and in some embodiments, the method 200 may then proceed to block 214-1 where a contact metal etch-back process is performed. Referring to the example of the device 300A as shown in FIGS. 8A and 9A, in an embodiment of block 214-1, the metal layer 702 is etched-back to provide an etched-back metal layer 702A and recesses 902. In some embodiments, the contact metal etch-back process may include a wet etch, a dry etch, or a combination thereof.

Alternatively, after block 212 and in some embodiments, the method 200 may proceed to block 214-2 where a nitride layer etch-back, a dielectric layer deposition, and a contact metal etch-back process are performed. Referring to the example of the device 300B as shown in FIGS. 8B and 9B, in an embodiment of block 214-2, the metal layer 702 may be etched-back to provide the etched-back metal layer 702A and the recesses 902. In some embodiments, the contact metal etch-back process may include a wet etch, a dry etch, or a combination thereof. Additionally, in some embodiments, the etched-back nitride layer 404B (or etched-back a-Si layer), disposed over the liner layer 406 may also be etched back and/or removed completely (e.g., using a dry etch, a wet etch, or combination thereof) and replaced by an oxide layer 904 (e.g., such as a low-K dielectric). That is, in some embodiments, the oxide layer 904 may be deposited (e.g., by CVD, ALD, or other suitable process) over the liner layer 406 in an opening formed by removal of the etched-back nitride layer 404B. In various examples, the contact metal etch-back process may be performed before the nitride layer removal and oxide layer deposition. Alternatively, in some embodiments, the nitride layer removal and oxide layer deposition may be performed before the contact metal etch-back process.

Figures 10A, 10B:
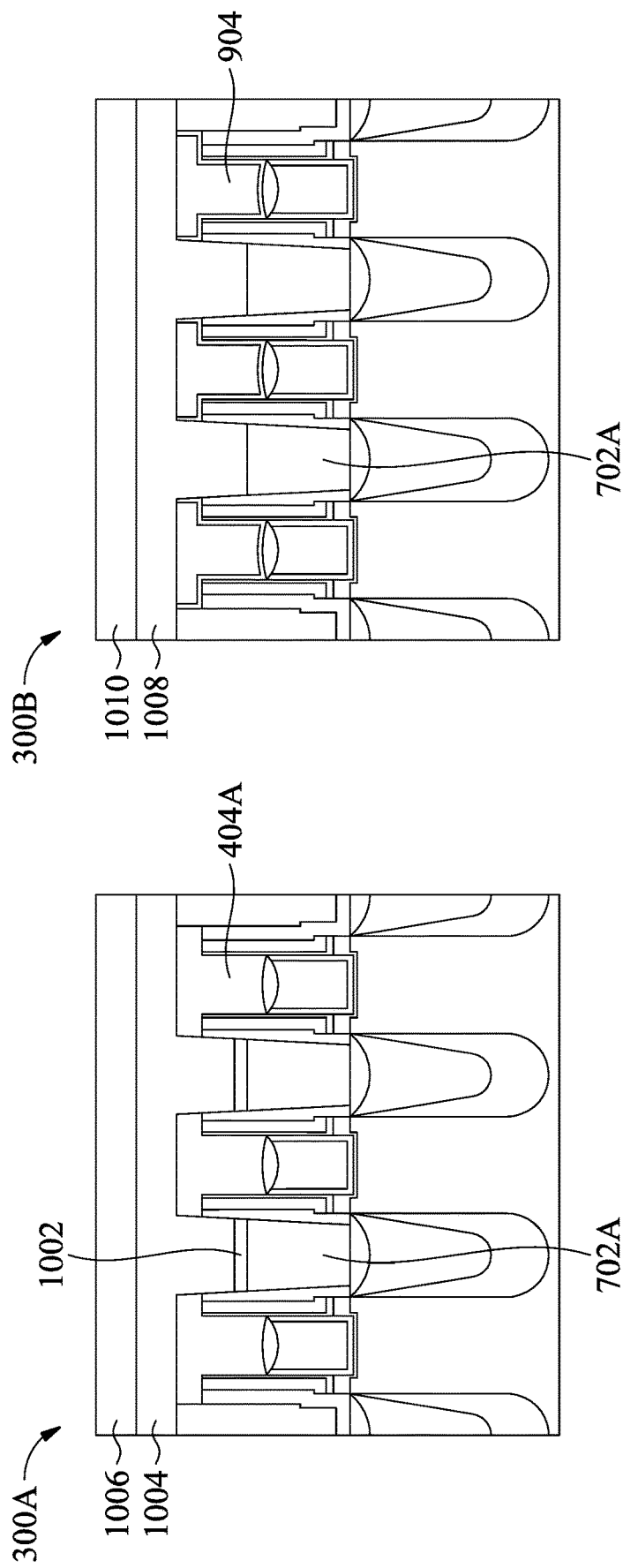

With reference to the device 300A, and after block 214-1, the method 200 proceeds to block 216-1 where a metal cap layer, a contact etch-stop layer (CESL), and an ILD layer are deposited. As shown in the example of FIGS. 9A and 10A, in an embodiment of block 216-1, a metal cap layer 1002 may be deposited over the etched-back metal layer 702A within the recesses 902. In some cases, the metal cap layer 1002 may prevent oxidation of the etched-back metal layer 702A. In some embodiments, the metal cap layer 1002 includes a W metal layer, which may be deposited by PVD, e-beam evaporation, ALD, CVD, or other appropriate method. In a further embodiment of block 216-1, a CESL 1004 may be deposited over the device 300A, including within the recesses 902 and over the metal cap layer 1002. In various examples, the CESL 1004 may include SiCO, SiC, oxide, a low-K dielectric, or other appropriate layer. In some cases, after forming the CESL 1004, a CMP process may be performed to planarize a top surface of the device 300A. Thereafter, in some embodiments, another ILD layer 1006 may be deposited over the CESL layer 1004. By way of example, the ILD layer 1006 may include an oxide layer, a low-K dielectric layer, or other appropriate dielectric layer. In some cases, after forming the ILD layer 1006, a CMP process may be performed to planarize a top surface of the device 300A.

Referring to the device 300B, and after block 214-2, the method 200 proceeds to block 216-2 where a CESL and an ILD layer are deposited. As shown in the example of FIGS. 9B and 10B, in an embodiment of block 216-2, a CESL 1008 may be deposited over the device 300B, including within the recesses 902. In various examples, the CESL 1008 may include SiN, a low-K dielectric, or other appropriate layer. In some cases, after forming the CESL 1008, a CMP process may be performed to planarize a top surface of the device 300B. Thereafter, in some embodiments, another ILD layer 1010 may be deposited over the CESL layer 1008. By way of example, the ILD layer 1010 may include an oxide layer, a low-K dielectric layer, or other appropriate dielectric layer. In some cases, after forming the ILD layer 1010, a CMP process may be performed to planarize a top surface of the device 300B.

The devices 300A and 300B may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figures 11A, 11B:
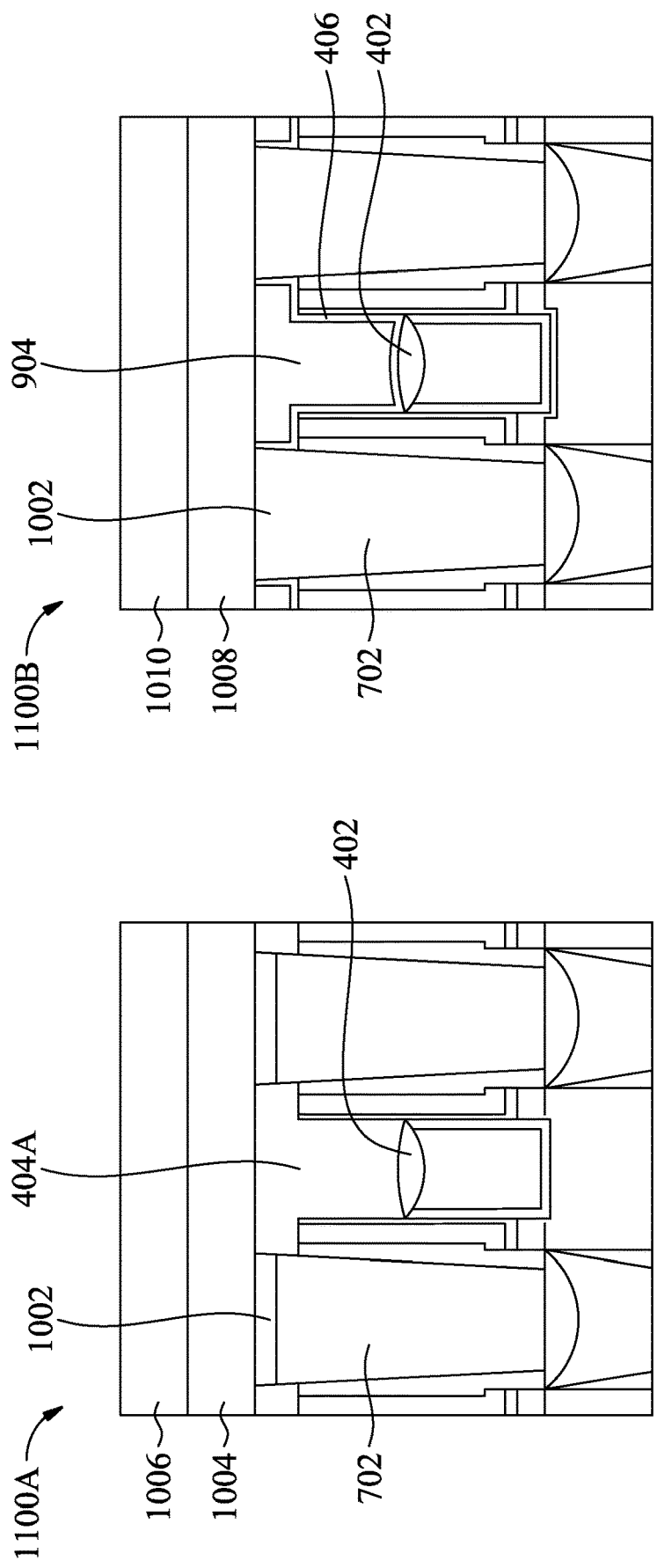

Referring now to FIG. 11A, illustrated therein is a device 1100A that may be fabricated in a manner substantially similar in many respects to the device 300A, described above with reference to the method 200. Thus, many aspects of the description of the method 200, with respect to the device 300A, also apply to the device 1100A. However, in an embodiment, the fabrication of the device 1100A may skip the contact metal etch-back step (block 214-1). Thus, the metal cap layer, the CESL, and the ILD layer may be deposited (block 216-1) over a device substantially similar to that shown in FIG. 8A, thereby resulting in the device 1100A of FIG. 11A.

With reference to FIG. 11B, illustrated therein is a device 1100B that may be fabricated in a manner substantially similar in many respects to the device 300B, described above with reference to the method 200. Thus, many aspects of the description of the method 200, with respect to the device 300B, also apply to the device 1100B. However, in an embodiment, the fabrication of the device 1100B may skip the contact metal etch-back portion of the block 214-2, while still performing the nitride layer etch-back and dielectric deposition processes of block 214-2. Thus, the CESL and the ILD layer may be deposited (block 216-2) over a device including the oxide layer 904 (e.g., shown in FIG. 9B), and including the non-recessed metal layer 702 (e.g., shown in FIG. 8B), thereby resulting in the device 1100B of FIG. 11B.

Figure 12:
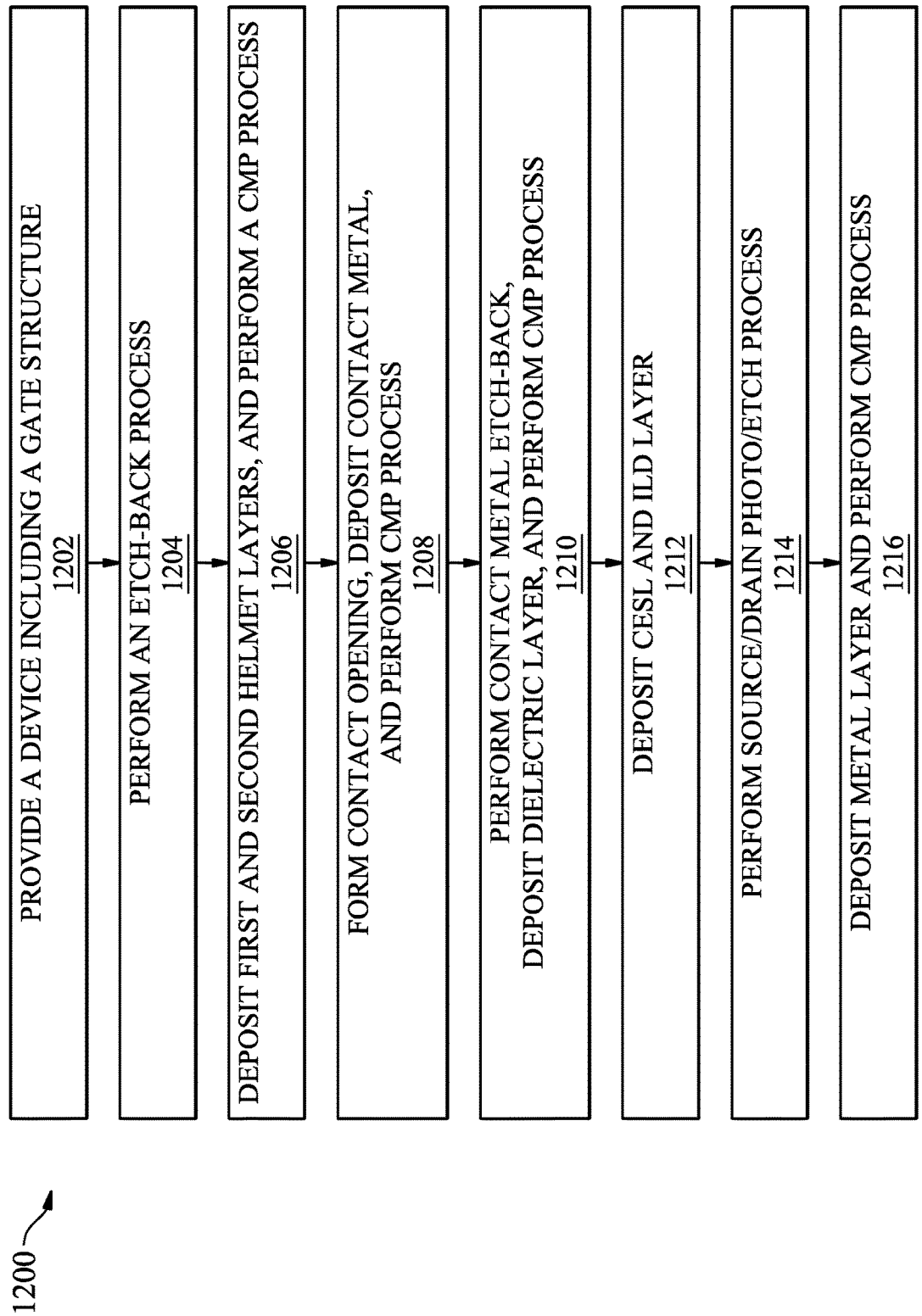
FIG. 12 is a flow chart of another method of fabricating a semiconductor device including a T-shaped helmet, in accordance with some embodiments.

Referring now to FIG. 12, illustrated is a method 1200 of fabricating a semiconductor device (e.g., such as a FinFET device) including T-shaped helmet, in accordance with one or more embodiments. In some embodiments, the method 1200 may be used to fabricate the device 100, described above with reference to FIG. 1. Thus, one or more aspects discussed above with reference to the device 100 may also apply to the method 1200. In addition, the method 1200 may be substantially similar to the method 200 in many respects. Thus, aspects of the description of the method 100 above also apply to the method 1200. Embodiments of the method 1200 provide a bilayer T-shaped helmet (e.g., formed on a metal gate), where a first helmet layer protects a spacer layer during an etch process and prevents a second helmet layer from oxidizing the metal gate, as discussed in further detail below. Additionally, FIGS. 13-20 provide cross-sectional views, along a plane substantially parallel to a plane defined by section AA' of FIG. 1, of an exemplary device 1300 fabricated according to one or more steps of the method 1200 of FIG. 12.

It is understood that parts of the method 1200 and/or the semiconductor device 1300 may be fabricated by a well-known CMOS technology process flow, and thus some processes are only briefly described herein. In addition, as described above, the device 1300 may share aspects of the device 100, thus some aspects and/or processes of the device 1300 are only discussed briefly for purposes of clarity in understanding. Further, the semiconductor device 1300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 1300 includes a plurality of semiconductor devices (e.g., transistors), which may be interconnected.

In various embodiments, the device 1300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), high voltage transistors, high frequency transistors, other memory cells, and/or combinations thereof.

Figure 13:
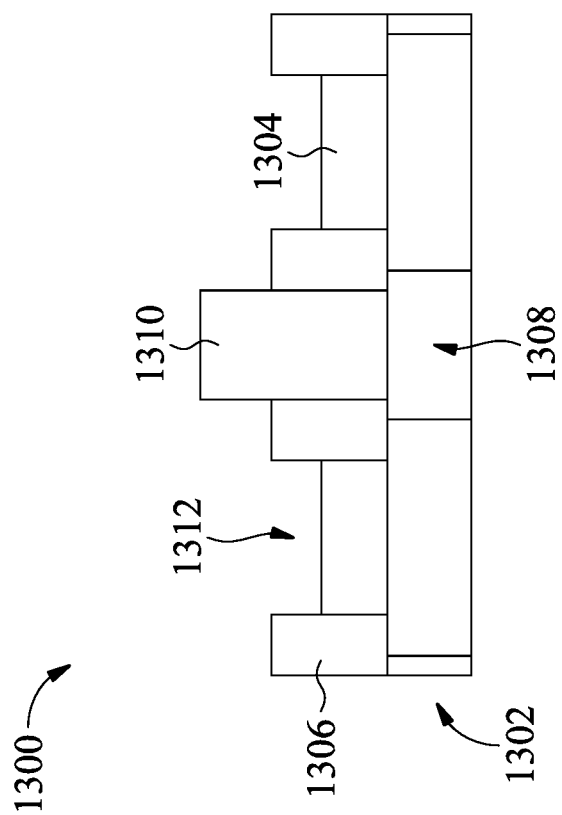

Referring now to the method 1200, the method 1200 begins at block 1202 where a device including a gate structure is provided. Referring to FIG. 13, and in an embodiment of block 1202, illustrated therein is a device 1300 including a fin 1302 that extends from a substrate, a gate structure 1304 including a gate dielectric layer, and a metal layer over the gate dielectric layer. In some embodiments, the substrate, the fin 1302, the gate dielectric layer, and the metal layer may be substantially similar to the substrate 102, the fin elements 104, the gate dielectric layer 110, and the metal layer 112 discussed above with reference to FIG. 1. The device 1300 also includes a sidewall spacer 1306 formed on sidewalls of the gate structure 1304. In some cases, the sidewall spacer 1306 may be substantially the same as one or more of the plurality of sidewall spacer layers 308, 310, 312, discussed above. In some embodiments, the sidewall spacer 1306 may include the liner layer 314, previously discussed.

In some embodiments, the device 1300 also includes epitaxial source/drain features 1308 formed in, on, and/or surrounding the fin 1302. In various examples, a silicide layer may be formed over the epitaxial source/drain features 1308, for example, to reduce contact resistance. In some cases, the device 1300 also includes an ILD layer 1310 over the epitaxial source/drain features 1308, interposing sidewall spacers 1306 on adjacent gate structures 1304. In some embodiments, the ILD layer 1310 may be substantially the same as the ILD layer 318, discussed above.

The method 1200 then proceeds to block 1204 where an etch-back process is performed. Still referring to the example of FIG. 13, in an embodiment of block 1204, a metal gate etch-back process is performed to etch-back the metal layer of the gate structure 1304. In some embodiments, the metal gate etch-back process may include a wet etch, a dry etch, or a combination thereof. In a further embodiment of block 1204, a spacer etch-back process may be used to etch-back the sidewall spacers 1306. In some examples, the spacer etch-back process may include a wet etch, a dry etch, or a combination thereof. In various examples, the metal gate etch-back process may be performed before the spacer etch-back process. Alternatively, in some embodiments, the spacer etch-back process may be performed before the metal gate etch-back process. It is also noted that the etch-back process of block 1204 may result in a generally T-shaped opening 1312 over the gate structure 1304, as shown in FIG. 13.

Figure 14:
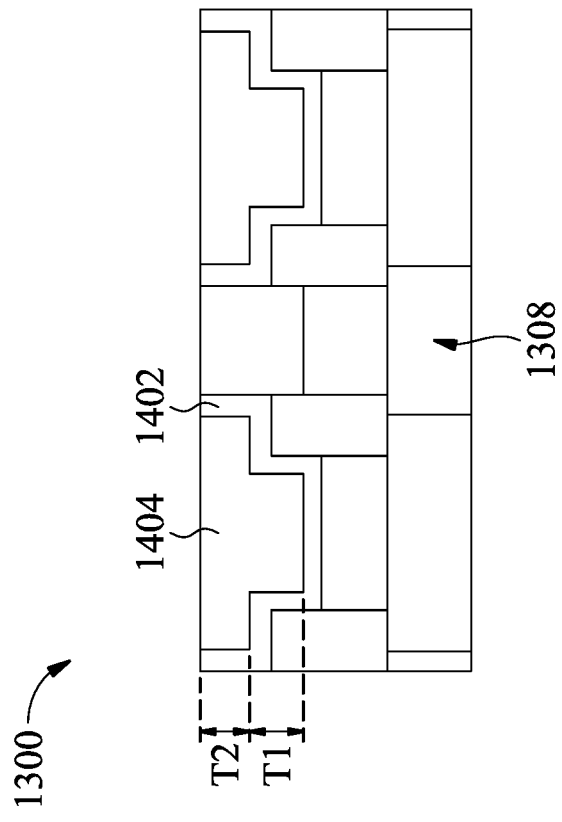
FIGS. 13, 14, 15, 16, 17, 18, 19, and 20 provide cross-sectional views, along a plane substantially parallel to a plane defined by section AA' of FIG. 1, of exemplary devices fabricated according to one or more steps of the method of FIG. 12.

After block 1204, and in some embodiments, the method 1200 may then proceed to block 1206 where a first helmet layer and a second helmet layer are deposited, and where a CMP process is performed. Referring to the example of FIGS. 13 and 14, in an embodiment of block 1206, a first helmet layer 1402 is conformally deposited over the etched-back gate structure 1304, and over the etched-back sidewall spacers 1306, within the T-shaped opening 1312. In some embodiments, the first helmet layer includes LaO, AlO, AlON, ZrO, HfO, SiN, Si, ZnO, ZrN, ZrAlO, TiO, TaO, YO, TaCN, ZrSi, HfSi, SiOCN, SiOCN, SiOC, or SiCN. In some examples, the first helmet layer 1402 has a thickness of about 1-20 nm. In various embodiments, the first helmet layer 1402 may be deposited using CVD, ALD, PVD, or other suitable method. In a further embodiment of block 1206, a second helmet layer 1404 is deposited over the first helmet layer 1402, where the second helmet layer 1404 substantially fills the T-shaped opening 1312. In some embodiments, the second helmet layer 1404 includes SiO, LaO, AlO, AlON, ZrO, HfO, SiN, Si, ZnO, ZrN, ZrAlO, TiO, TaO, YO, TaCN, ZrSi, HfSi, SiOCN, SiOC, or SiCN. As shown in FIG. 14, and in some cases, the second helmet layer 1404 has a first thickness 'T1' of about 1-50 nm, and a second thickness 'T2' of about 1-50 nm. Thus, in some embodiments, a total thickness of the second helmet layer 1404 may be between about 2-100 nm. In various embodiments, the second helmet layer 1404 may be deposited using CVD, ALD, PVD, or other suitable method. After deposition of the second helmet layer 1404, and in an embodiment of block 1206, a CMP process is performed to planarize a top surface of the device 1300.

It is noted that the CMP process performed after deposition of the second helmet layer 1404 simultaneously polishes/planarizes both of the first helmet layer 1402 and the second helmet layer 1404, reducing process complexity, cost, and gate height loss/loading. In addition, with the first helmet layer 1402 protecting the etched-back gate structure 1304, the second helmet layer 1404 could be a low-K/oxide-based material, as noted above, to reduce fringing capacitance between the metal gate and source/drain regions and increase device performance. Moreover, the first helmet layer 1402 effectively prevents oxidation of the metal gate of the gate structure 1304, thus avoiding threshold voltage (Vt) variation.

The method 1200 proceeds to block 1208 where contact openings are formed, contact metal is deposited, and a CMP process is performed. Referring to the example of FIGS. 14 and 15, in an embodiment of block 1208, another ILD layer (e.g., oxide layer, low-K dielectric layer, etc.) may first be deposited over the device 1300, after which source/drain contact patterning and etching processes are performed. As described above, the source/drain contact patterning and etching processes may be used to form a contact opening in the another ILD layer, and in the ILD layer 1310, to expose the epitaxial source/drain features 1308. In a further embodiment of block 1208, a contact metal is deposited. For example, a metal layer 1502 may be deposited within the contact opening over the epitaxial source/drain features 1308, such that metal layer 1502 provides an electrical connection to the epitaxial source/drain features 1308. In at least some examples, the metal contact layer 1502 includes a Co layer, although other suitable metals may be used without departing from the scope of the present disclosure. In some cases, the metal layer 1502 may be deposited by PVD, e-beam evaporation, CVD, ALD, or other appropriate method. After forming the metal layer 1502, and in a further embodiment of block 1208, a CMP process is performed to planarize a top surface of the device 1300.

The method 1200 proceeds to block 1210 where a contact metal etch-back process, a dielectric layer deposition process, and a CMP process are performed. Referring to the example of FIGS. 15 and 16, in an embodiment of block 1210, the metal layer 1502 may be etched-back to provide the etched-back metal layer 1502A. In some embodiments, the contact metal etch-back process may include a wet etch, a dry etch, or a combination thereof. In a further embodiment of block 1210, a dielectric layer 1602 is then deposited (e.g., by CVD, ALD, or other suitable process) over the etched-back metal layer 1502A. In some embodiments, the dielectric layer 1602 includes SiO, LaO, AlO, AlON, ZrO, HfO, SiN, Si, ZnO, ZrN, ZrAlO, TiO, TaO, YO, TaCN, ZrSi, HfSi, SiOCN, SiOC, or SiCN. In various examples, the dielectric layer 1602 has a thickness between about 0-50 nm. A thickness of 0 nm may correspond to embodiments where the dielectric layer 1602 is not used, as described in more detail below. After forming the dielectric layer 1602, and in a further embodiment of block 1210, a CMP process is performed to planarize a top surface of the device 1300.

Figure 16:
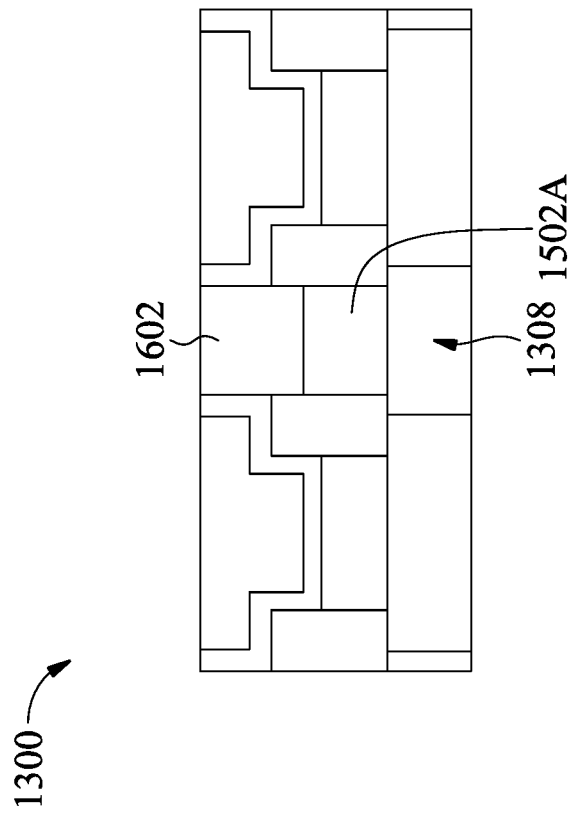
Figure 15:
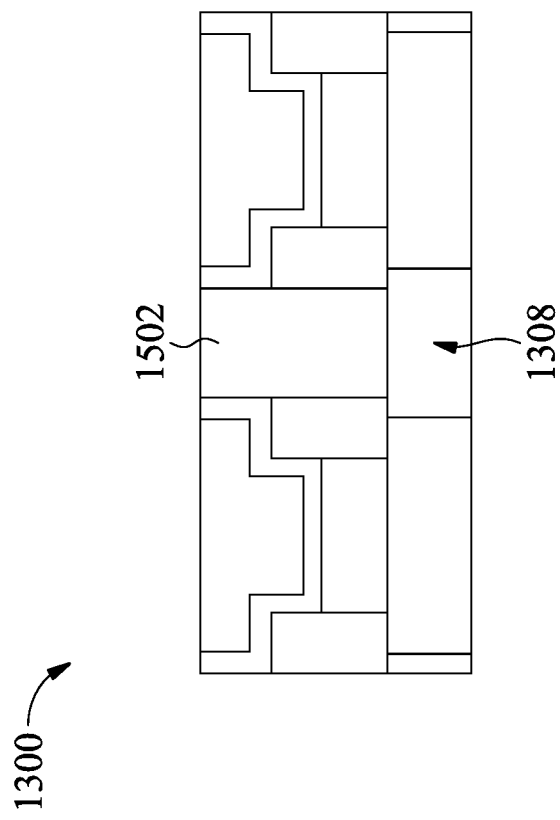
Figure 18:
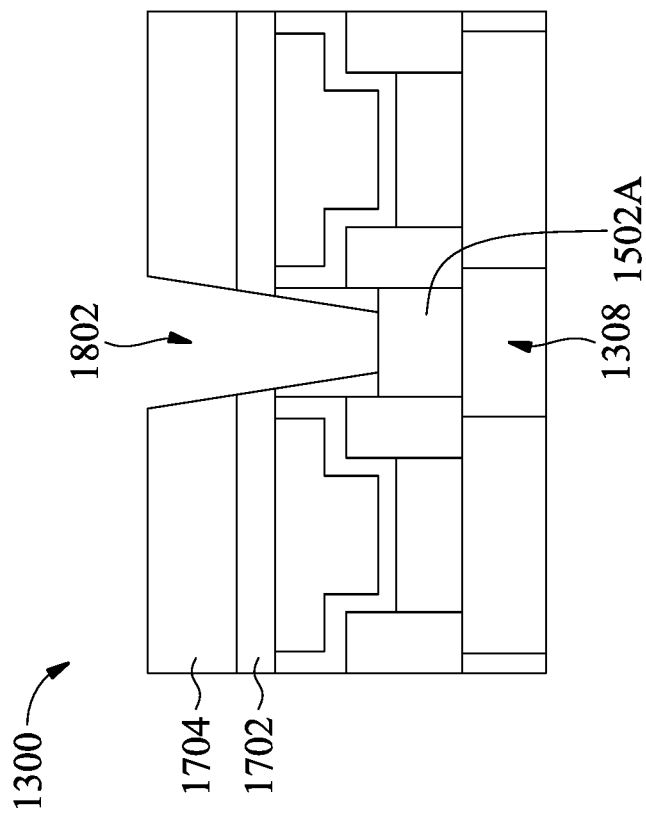
Figure 17:
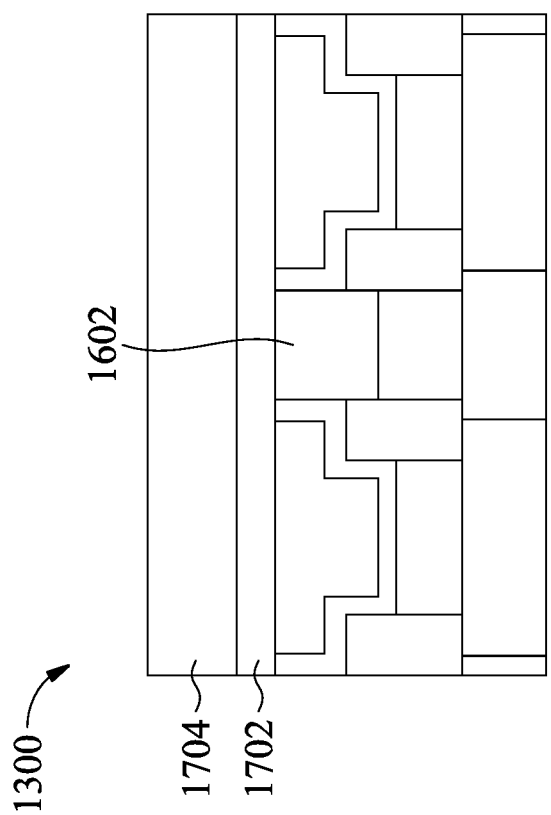

After block 1210, the method 1200 proceeds to block 1212 where a CESL and an ILD layer are deposited. As shown in the example of FIGS. 16 and 17, in an embodiment of block 1212, a CESL 1702 may be deposited over the device 1300. In various examples, the CESL 1702 may include SiCO, SiC, SiN, oxide, a low-K dielectric, or other appropriate layer. In some cases, after forming the CESL 1702, a CMP process may be performed to planarize a top surface of the device 1300. Thereafter, in some embodiments, an ILD layer 1704 may be deposited over the CESL layer 1702. By way of example, the ILD layer 1704 may include an oxide layer, a low-K dielectric layer, or other appropriate dielectric layer. In some cases, after forming the ILD layer 1704, a CMP process may be performed to planarize a top surface of the device 1300.

The method 1200 proceeds to block 1214 where a source/drain photolithography and etching process are performed. Referring to the example of FIGS. 17 and 18, in an embodiment of block 1214, a source/drain photolithography and etching process is performed to form an opening 1802 that exposes the etched-back metal layer 1502A. In some embodiments, the source/drain photolithography and etching process includes depositing a resist layer over the ILD layer 1704, exposing the resist to a pattern, performing post-exposure bake processes, and developing the resist to form a patterned resist layer (e.g., a masking element) over the ILD layer 1704. In some embodiments, the patterned resist layer may then be used to protect regions of the substrate while an etching process is used to form the opening 1802. In various embodiments, the opening 1802 may be etched using a dry etch, a wet etch, or a combination thereof. As shown, formation of the opening 1802 may include etching portions of the ILD layer 1704, the CESL 1702, and the dielectric layer 1602. Further, in at least some examples, the first helmet layer 1402 is used to effectively protect the sidewall spacer 1306 during formation of the opening 1802. Additionally, in some embodiments, the etching process used to form the opening 1802 is selective at least between the dielectric layer 1602 and the first helmet layer 1402.

Figure 20:
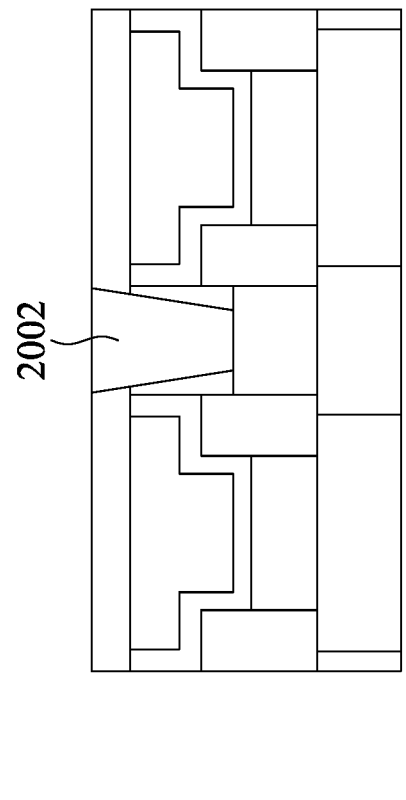
Figure 19:
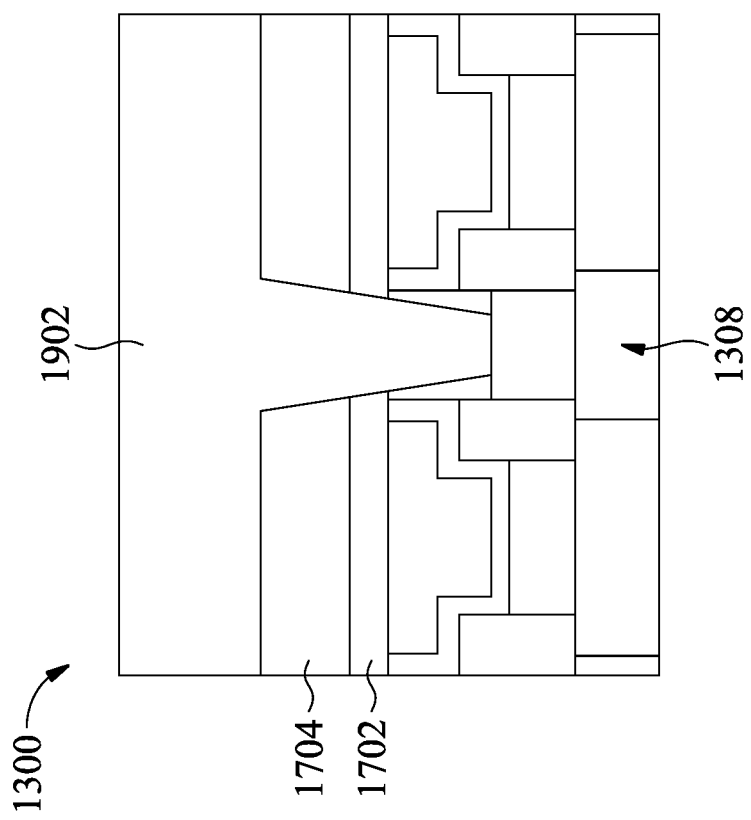

The method 1200 proceeds to block 1216 where a metal layer is deposited, and a CMP process is performed. Referring to the example of FIGS. 18 and 19, in an embodiment of block 1216, a metal layer 1902 is deposited over the device 1300, within the opening 1802, and in contact with the etched-back metal layer 1502A. Thus, in various examples, the metal layer 1902 provides an electrical contact to the epitaxial source/drain features 1308 (e.g., through the etched-back metal layer 1502A). In some embodiments, the metal layer 1902 includes W, TiN, TaN, WN, Re, Ir, Ru, Mo, Al, Cu, Co, Ni, combinations thereof, and/or other suitable compositions. In some cases, the metal layer 1902 may be formed using PVD, CVD, e-beam evaporation, and/or other suitable process. Referring to the example of FIGS. 19 and 20, in a further embodiment of block 1216, a CMP process is performed. In some embodiments, the CMP process may be used to remove an excess portion of the metal layer 1902 and form a metal plug 2002, to remove a remaining portion of the ILD layer 1704, and generally to planarize a top surface of the device 1300, as shown in FIG. 20.

The device 1300 may undergo further processing to form various features and regions known in the art. For example, subsequent processing may form various vias/lines and multilayer interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 21:
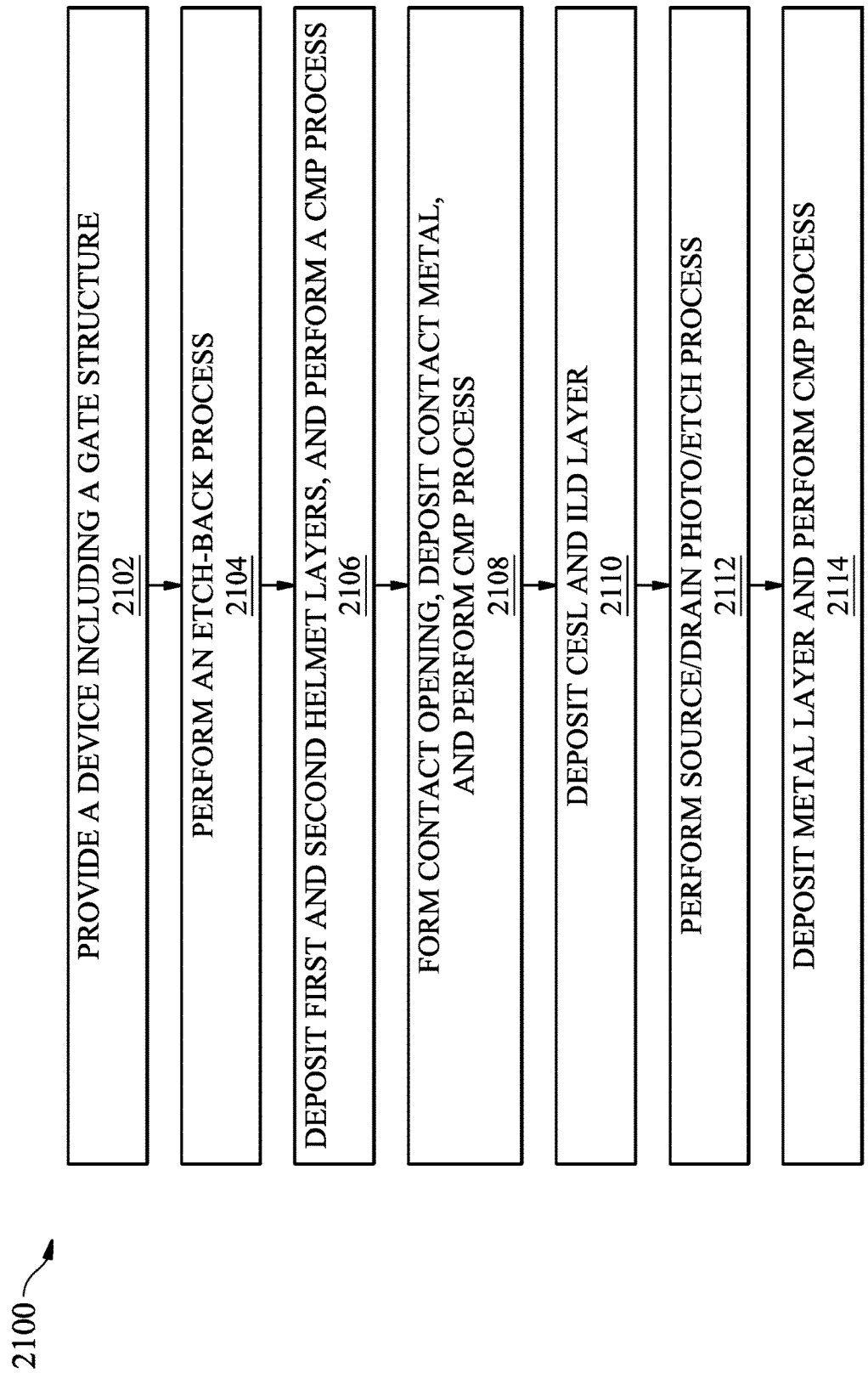
FIG. 21 is a flow chart of another method of fabricating a semiconductor device including a T-shaped helmet, in accordance with some embodiments.
Figure 26:
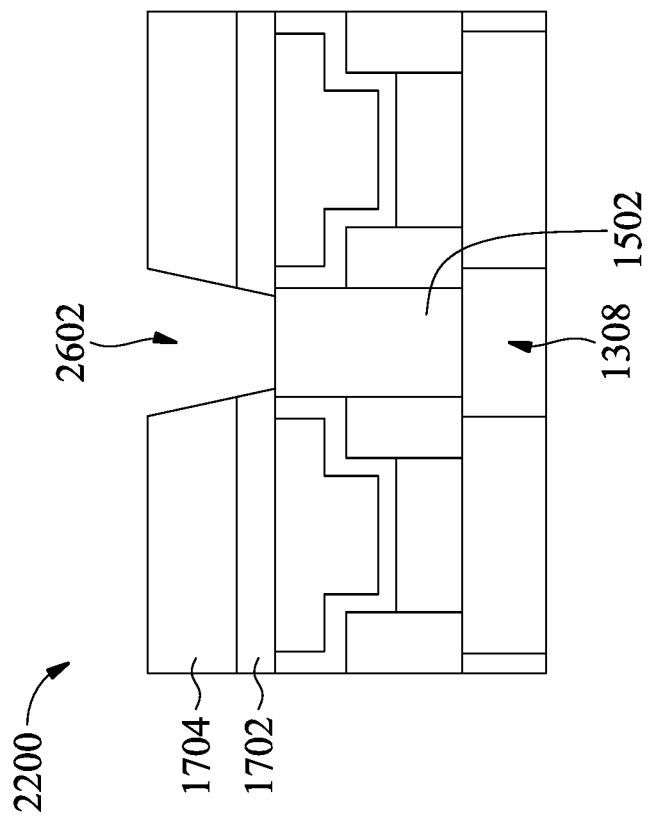
Figure 25:
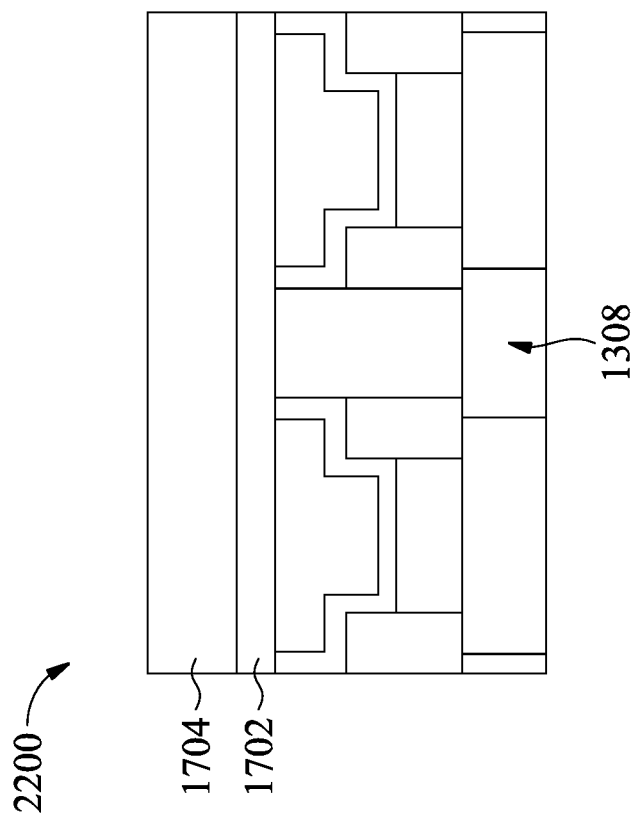
Figure 28:
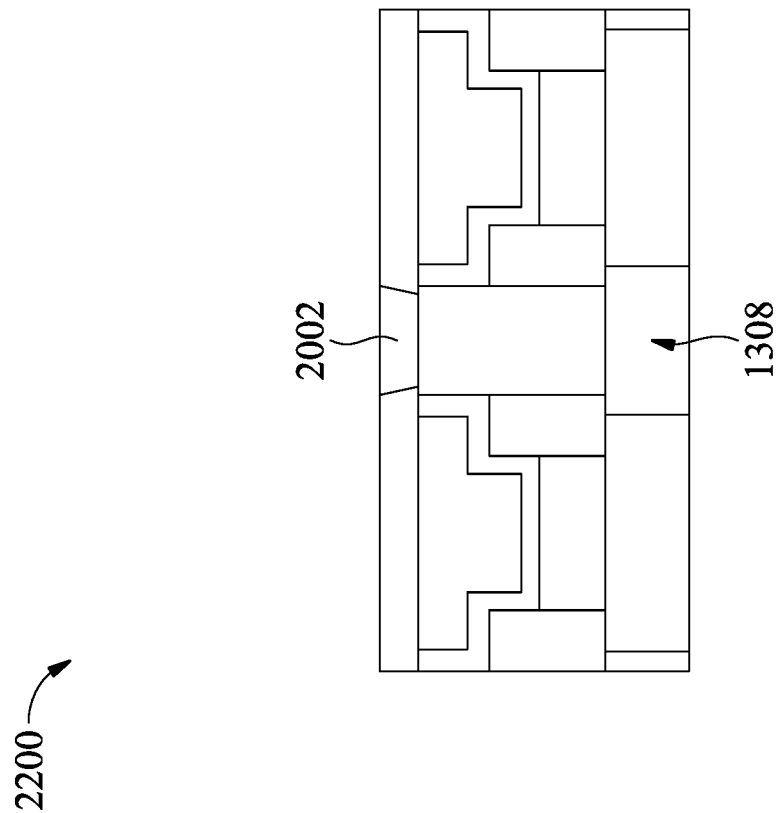
Figure 27:
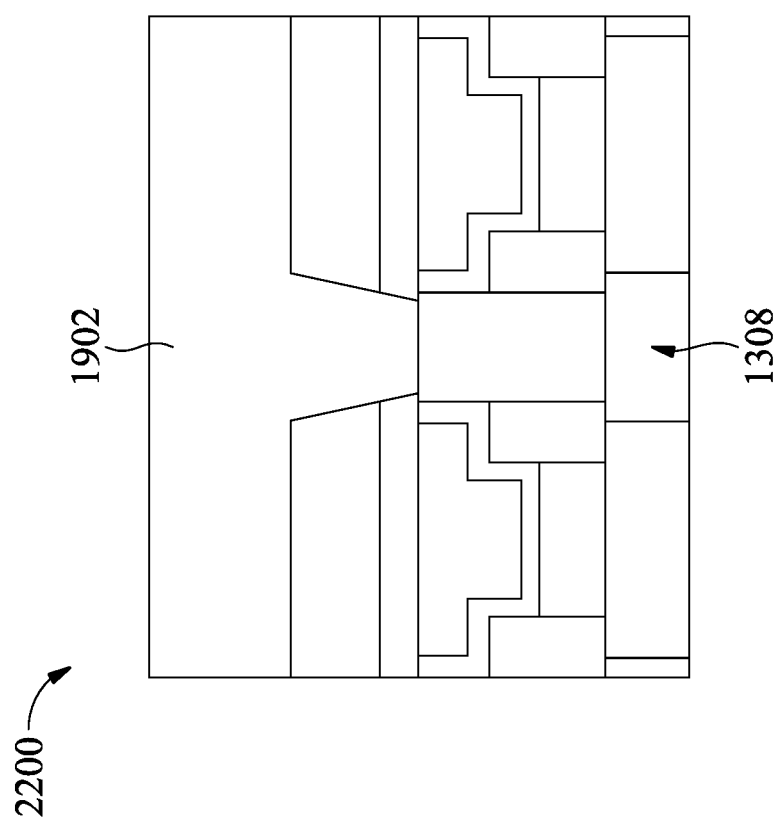

Referring now to FIG. 21, illustrated is a method 2100 of fabricating a semiconductor device (e.g., such as a FinFET device) including T-shaped helmet, in accordance with one or more embodiments. The method 2100 is substantially similar to the method 1200 in many respects and the description of the method 1200 above also applies to the method 2100. However, some embodiments of the method 2100 may skip the contact metal etch-back process (block 1210 of the method 1200), as discussed in further detail below. Additionally, FIGS. 22-28 provide cross-sectional views, along a plane substantially parallel to a plane defined by section AA' of FIG. 1, of an exemplary device 2200 fabricated according to one or more steps of the method 2100 of FIG. 21.

The method 2100 begins at block 2102 where a device including a gate structure is provided. Block 2102 may be substantially similar to block 1202, discussed above with reference to the method 1200 of FIG. 12. Referring to the example of FIG. 22, a device 2200 including a gate structure 1304, a sidewall spacer 1306, epitaxial source/drain features 1308, and an ILD layer 1310 is provided, as discussed above.

The method 2100 proceeds to block 2104 where an etch-back process is performed. Block 2104 may be substantially similar to block 1204, discussed above with reference to the method 1200 of FIG. 12. Referring again to the example of FIG. 22, a metal gate etch-back process and a spacer etch-back process may be performed, as discussed above. The etch-back process of block 2104 may result in a generally T-shaped opening 1312 over the gate structure 1304, as shown in FIG. 22.

The method 2100 proceeds to block 2106 where a first helmet layer and a second helmet layer are deposited, and where a CMP process is performed. Block 2106 may be substantially similar to block 1206, discussed above with reference to the method 1200 of FIG. 12. Referring to the example of FIG. 23, a first helmet layer 1402 is conformally deposited within the T-shaped opening 1312, and a second helmet layer 1404 is deposited over the first helmet layer 1402, as discussed above.

The method 2100 proceeds to block 2108 where contact openings are formed, contact metal is deposited, and a CMP process is performed. Block 2108 may be substantially similar to block 1208, discussed above with reference to the method 1200 of FIG. 12. Referring to the example of FIG. 24, after appropriate layer deposition, patterning, and etching, a metal layer 1502 is deposited that provides an electrical connection to the epitaxial source/drain features 1308, as discussed above.

In contrast to the method 1200, the method 2100 does not include a contact metal etch-back step (e.g., such as block 1210 of the method 1200), and instead after block 2108, the method 2100 proceeds to block 2110 where a CESL and an ILD layer are deposited. Block 2110 may be substantially similar to block 1212, discussed above with reference to the method 1200 of FIG. 12. Referring to the example of FIG. 25, the CESL 1702 is deposited over the device 2200, and the ILD layer 1704 is deposited over the CESL 1702, as discussed above.

The method 2100 proceeds to block 2112 where a source/drain photolithography and etching process are performed. Block 2112 may be substantially similar to block 1214, discussed above with reference to the method 1200 of FIG. 12. Referring to the example of FIG. 26, a source/drain photolithography and etching process is performed to form an opening 2602 that exposes the metal layer 1502, as discussed above.

The method 2100 proceeds to block 2114 where a metal layer is deposited, and a CMP process is performed. Block 2114 may be substantially similar to block 1216, discussed above with reference to the method 1200 of FIG. 12. Referring to the example of FIGS. 27 and 28, a metal layer 1902 is formed in contact with the metal layer 1502, and a CMP process is used to remove an excess portion of the metal layer 1902 and form a metal plug 2002, as discussed above. The device 2200 may undergo further processing to form various features and regions known in the art, as discussed above.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for reducing a transistor Ctotal, protecting against layer loss, avoiding metal gate oxidation, and mitigating gate height loss/loading, among others, and thereby improving device performance. In some embodiments, a bilayer helmet SAC scheme is provided, which may be used to provide a high source/drain metal (MD) etch selectivity and a low Ctotal. In some embodiments, the bilayer helmet includes a T-shaped helmet that includes a low-K material. Additionally, in some embodiments, a liner layer (e.g., a metal-oxide liner layer) may be used to protect a metal layer (e.g., such as a fluorine-free tungsten layer (FFW)), an ILD layer, and a spacer layer during an etch-back process (e.g., during a SiN etch-back process) to avoid a work-function metal induced threshold voltage (Vt) shift. Various embodiments disclosed herein may also generally be used to reduce process cost and complexity. Additional embodiments and advantages will be evident to those skilled in the art in possession of this disclosure.

Thus, one of the embodiments of the present disclosure described a method where a device including a gate stack having a metal gate layer is provided. The device further includes a spacer layer disposed on a sidewall of the gate stack and a source/drain feature adjacent to the gate stack. The method further includes performing a first etch-back process to the metal gate layer to form an etched-back metal gate layer. In some embodiments, the method includes depositing a metal layer over the etched-back metal gate layer. In some cases, a semiconductor layer is formed over both the metal layer and the spacer layer to provide a T-shaped helmet layer over the gate stack and the spacer layer.

In another of the embodiments, discussed is a method where a device including a gate stack having an etched-back metal gate layer and etched-back spacer layers disposed on opposing sidewalls of the gate stack is provided. In some embodiments, the etched-back metal gate layer and the etched-back spacers collectively define a T-shaped opening. In various examples, a fluorine-free tungsten (FFW) layer is deposited over the etched-back metal gate layer. In some cases, a first helmet layer is formed over the FFW layer and within the T-shaped opening.

In yet another of the embodiments, discussed is a semiconductor device including a gate stack having a metal gate layer. The semiconductor device further includes sidewall spacers disposed on opposing sidewalls of the gate stack, a first T-shaped helmet layer conformally formed over the gate stack and sidewall spacers, and a second T-shaped helmet layer formed over the first T-shaped helmet layer. In some embodiments, the first T-shaped helmet layer is configured to prevent oxidation of the metal gate layer of the gate stack. In some examples, the second T-shaped helmet layer includes a low-K dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a device including a gate stack having a metal gate layer, a spacer layer disposed on a sidewall of the gate stack, and a source/drain feature adjacent to the gate stack;
performing a first etch-back process to the metal gate layer to form an etched-back metal gate layer;
depositing a metal layer over the etched-back metal gate layer; and
forming a semiconductor layer over both the metal layer and the spacer layer, wherein the semiconductor layer provides a T-shaped helmet layer over the gate stack and the spacer layer.

2. The method of claim 1, wherein the depositing the metal layer over the etched-back metal gate layer further includes depositing a fluorine-free tungsten (FFW) layer over the etched-back metal gate layer.

3. The method of claim 1, wherein the forming the semiconductor layer over both the metal layer and the spacer layer further includes forming one of a silicon nitride (SiN) layer and an amorphous silicon (a-Si) layer over both the metal layer and the spacer layer.

4. The method of claim 1, further comprising:
prior to the forming the semiconductor layer over both the metal layer and the spacer layer, conformally depositing a liner layer over the metal layer and on a portion of the spacer layer.

5. The method of claim 4, wherein the depositing the liner layer further includes depositing a high-K liner layer.

6. The method of claim 4, wherein the liner layer prevents etching of the metal layer and the spacer layer during a subsequent etching process.

7. The method of claim 1, further comprising:
performing a second etch-back process to the semiconductor layer to form an etched-back semiconductor layer; and
forming a dielectric layer over the etched-back semiconductor layer.

8. The method of claim 1, further comprising:
depositing a contact metal layer over the source/drain feature;
etching back the contact metal layer to provide an etched-back contact metal layer; and
depositing a contact etch stop layer (CESL) over the etched-back contact metal layer.

9. The method of claim 8, further comprising:
after forming the semiconductor layer over both the metal layer and the spacer layer, replacing the semiconductor layer with a low-K dielectric layer.

10. The method of claim 8, further comprising:
prior to depositing the CESL, forming a cap layer over the etched-back contact metal layer, wherein the cap layer prevents oxidation of the etched-back contact metal layer.

11. A method, comprising:
providing a device including a gate stack having an etched-back metal gate layer and etched-back spacer layers disposed on opposing sidewalls of the gate stack, wherein the etched-back metal gate layer and the etched-back spacer layers collectively define a T-shaped opening;
depositing a fluorine-free tungsten (FFW) layer over the etched-back metal gate layer; and
forming a helmet layer over the FFW layer and within the T-shaped opening such that the helmet layer defines a T-shaped helmet layer.

12. The method of claim 11, wherein the forming the helmet layer further includes forming one of a silicon nitride (SiN) layer and an amorphous silicon (a-Si) layer over the FFW layer and within the T-shaped opening.

13. The method of claim 11, further comprising:
prior to the forming the helmet layer, depositing a high-K liner layer over the FFW layer and along sidewalls of the T-shaped opening; and
forming the helmet layer over the high-K liner layer.

14. The method of claim 11, further comprising:
etching-back the helmet layer to form an etched-back helmet layer; and
depositing a high-K dielectric layer over the etched-back helmet layer.

15. The method of claim 14, further comprising:
depositing a contact metal layer over a source/drain feature adjacent to the gate stack; and
performing a chemical mechanical polishing (CMP) process to remove a portion of the contact metal layer, wherein the CMP process also removes the high-K dielectric layer.

16. The method of claim 15, further comprising:
after performing the CMP process, forming a cap layer over the contact metal layer, wherein the cap layer prevents oxidation of the contact metal layer; and
depositing a contact etch stop layer (CESL) over the cap layer.

17. The method of claim 15, further comprising:
after performing the CMP process, replacing the helmet layer with a low-K dielectric layer.

18. A method, comprising:
forming a T-shaped opening over a gate structure, wherein a bottom surface of the T-shaped opening is defined by an etched-back metal gate layer, and wherein sidewall surfaces of the T-shaped opening are at least partially defined by sidewall spacers;
depositing a metal layer in contact with the etched-back metal gate layer, wherein the sidewall surfaces of the T-shaped opening are substantially free of the metal layer; and
depositing a silicon (Si)-based layer within the T-shaped opening and in contact with both the bottom surface and the sidewall surfaces of the T-shaped opening, wherein the Si-based layer defines a T-shaped helmet layer.

19. The method of claim 18, further comprising:
depositing a high-K dielectric layer over the T-shaped helmet layer; and
forming a source/drain contact opening adjacent to the gate structure, wherein the forming the source/drain contact opening at least partially etches the high-K dielectric layer, and wherein the high-K dielectric layer prevents etching of the T-shaped helmet layer.

20. The method of claim 19, further comprising:
depositing a contact metal layer within the source/drain contact opening and in contact with a source/drain feature; and
forming a metal cap layer over the contact metal layer.

* * * * *